US012677555B2

(12) United States Patent　　　　　(10) Patent No.:　US 12,677,555 B2
Yoon et al.　　　　　　　　　　　　　(45) Date of Patent:　　Jul. 7, 2026

(54) DISPLAY APPARATUS

(71) Applicant: Samsung Display Co., Ltd., Yongin-si
(KR)

(72) Inventors: Youngsoo Yoon, Yongin-si (KR);
Wonkyu Kwak, Yongin-si (KR);
Sukyoung Kim, Yongin-si (KR);
Taehyoung No, Yongin-si (KR);
Hyungjun Park, Yongin-si (KR);
Hwayoung Song, Yongin-si (KR);
Konhaeng Lee, Yongin-si (KR);
Bongwon Lee, Yongin-si (KR);
Haeyeon Lee, Yongin-si (KR);
Seunghan Jo, Yongin-si (KR)

(73) Assignee: Samsung Display Co., Ltd., Yongin-si
(KR)

( * ) Notice: Subject to any disclaimer, the term of this
patent is extended or adjusted under 35
U.S.C. 154(b) by 321 days.

(21) Appl. No.: 18/363,565

(22) Filed: Aug. 1, 2023

(65) Prior Publication Data

US 2024/0155894 A1　　May 9, 2024

(30) Foreign Application Priority Data

Nov. 4, 2022　　(KR) ........................ 10-2022-0146380

(51) Int. Cl.
*H10K 59/131*　　　(2023.01)
(52) U.S. Cl.
CPC ................................. *H10K 59/131* (2023.02)

(58) Field of Classification Search
CPC .. H10K 59/131; H10K 59/1315; H10K 59/10;
H10K 50/844; H10K 59/1213
See application file for complete search history.

(56) References Cited

U.S. PATENT DOCUMENTS 9,843,020 B2　12/2017　Kim et al.
10,714,553 B2　7/2020　Kwon et al.
(Continued)

FOREIGN PATENT DOCUMENTS

KR　　10-2017-0012738 A　　2/2017
KR　　10-2019-0053585 A　　5/2019
(Continued)

*Primary Examiner* — Jarrett J Stark
(74) *Attorney, Agent, or Firm* — Womble Bond Dickinson
(US) LLP

(57)　　　　　　ABSTRACT

A display apparatus includes: a substrate having a display
area and a peripheral area; a scan driving circuit in the
peripheral area and adjacent to a first edge of the substrate
extending in a first direction; a scan driving circuit line in the
peripheral area, adjacent to a second edge of the substrate
extending in a second direction, and being electrically
connected to the scan driving circuit; a first power connec-
tion line in the peripheral area, adjacent to the second edge,
between a center of the second edge and the scan driving
circuit line, and extending in the first direction from a $1^{st}$-$1^{st}$
end portion to a $1^{st}$-$2^{nd}$ end portion, the $1^{st}$-$1^{st}$ end portion
being farther from the display area than the $1^{st}$-$2^{nd}$ end
portion is; and a power input line over the $1^{st}$-$1^{st}$ end portion
of the first power connection line and being electrically
connected thereto.

19 Claims, 17 Drawing Sheets

(56)           References Cited

U.S. PATENT DOCUMENTS

| | | | |
|---|---|---|---|
| 10,930,680 B2 | 2/2021 | Kang et al. | |
| 11,210,978 B2 * | 12/2021 | Im | H05K 1/028 |
| 12,225,788 B2 * | 2/2025 | Son | H10D 89/931 |
| 2019/0305072 A1 | 10/2019 | Park et al. | |
| 2022/0028956 A1 | 1/2022 | You | |
| 2022/0181423 A1 * | 6/2022 | Lee | G06F 1/1637 |
| 2022/0302179 A1 | 9/2022 | Park et al. | |
| 2024/0155894 A1 * | 5/2024 | Yoon | H10K 59/1315 |
| 2025/0225922 A1 * | 7/2025 | Kim | G09G 3/32 |

FOREIGN PATENT DOCUMENTS

| | | |
|---|---|---|
| KR | 10-2019-0087703 A | 7/2019 |
| KR | 10-2019-0116595 A | 10/2019 |
| KR | 10-2020-0066499 A | 6/2020 |
| KR | 10-2022-0014365 A | 2/2022 |

* cited by examiner

DISPLAY APPARATUS

CROSS-REFERENCE TO RELATED APPLICATION

This application claims priority to and the benefit of Korean Patent Application No. 10-2022-0146380, filed on Nov. 4, 2022, in the Korean Intellectual Property Office, the entire disclosure of which is incorporated herein by reference.

BACKGROUND

1. Field

Aspects of embodiments of the present disclosure relate to a display apparatus.

2. Description of the Related Art

A display apparatus has a display area and includes pixels arranged in the display area. Data lines are electrically connected to the pixels, and the pixels emit light having a brightness corresponding to electrical signals transmitted through the data lines.

SUMMARY

In related display apparatuses, the brightness of an image displayed in a display area may be inconsistent.

Embodiments of the present disclosure overcome various problems, including the aforementioned one, and provide a display apparatus displaying high-quality images. However, this is merely an example, and the scope of the present disclosure is not limited thereto.

Additional aspects and features of the present disclosure will be set forth, in part, in the description that follows and, in part, will be apparent from the description or may be learned by practice of the described embodiments of the present disclosure.

According to an embodiment of the present disclosure, a display apparatus includes: a substrate having a display area and a peripheral area outside the display area; a scan driving circuit in the peripheral area and adjacent to a first edge of the substrate, the first edge extending in a first direction; a scan driving circuit line in the peripheral area and adjacent to a second edge of the substrate, the second edge extending in a second direction crossing the first direction, the scan driving circuit line being electrically connected to the scan driving circuit; a first power connection line in the peripheral area, adjacent to the second edge, and extending in the first direction from a $1^{st}$-$1^{st}$ end portion to a $1^{st}$-$2^{nd}$ end portion, the $1^{st}$-$1^{st}$ end portion being farther from the display area than the $1^{st}$-$2^{nd}$ end portion is, the first power connection line being between a center of the second edge in the second direction and the scan driving circuit line; and a power input line over the $1^{st}$-$1^{st}$ end portion of the first power connection line and being electrically connected thereto.

The first power connection line and the scan driving circuit line may be on a same layer.

The display apparatus may further include a power transmission line over the $1^{st}$-$2^{nd}$ end portion of the first power connection line and electrically connected thereto.

The display apparatus may further include a plurality of pixels arranged in the display area and a common electrode on the plurality of pixels. The power transmission line may extend along the first edge and may be electrically connected to the common electrode.

The display apparatus may further include a plurality of driving power lines extending in the first direction into the display area. The power transmission line may extend along the second edge and may be electrically connected to the plurality of driving power lines.

The display apparatus may further include a first power connection additional line under the first power connection line and having a portion overlapping the first power connection line when viewed in a direction perpendicular to the substrate. The first power connection additional line may extend between a $1^{st}$-$1^{st}$ additional end portion and a $1^{st}$-$2^{nd}$ additional end portion, and the $1^{st}$-$1^{st}$ additional end portion may be farther from the display area than the $1^{st}$-$2^{nd}$ additional end portion is. The power input line may be electrically connected to the $1^{st}$-$1^{st}$ additional end portion of the first power connection additional line.

When viewed in the direction perpendicular to the substrate, the $1^{st}$-$1^{st}$ additional end portion may be closer to the second edge than the $1^{st}$-$1^{st}$ end portion is.

The display apparatus may further include a plurality of data transmission lines in the peripheral area, adjacent to the second edge, extending in the first direction, and between the center of the second edge in the second direction and the first power connection line.

The display apparatus may further include a second power connection line between the plurality of data transmission lines and extending in the first direction. The second power connection line may extend between a $2^{nd}$-$1^{st}$ end portion and a $2^{nd}$-$2^{nd}$ end portion, and the $2^{nd}$-$1^{st}$ end portion may be farther from the display area than the $2^{nd}$-$2^{nd}$ end portion is. The power input line may be electrically connected to the $2^{nd}$-$1^{st}$ end portion of the second power connection line.

The second power connection line and the first power connection line may be on a same layer.

The display apparatus may further include a power transmission line over the $1^{st}$-$2^{nd}$ end portion of the first power connection line and over the $2^{nd}$-$2^{nd}$ end portion of the second power connection line and being electrically connected thereto. The $1^{st}$-$2^{nd}$ end portion of the first power connection line and the $2^{nd}$-$2^{nd}$ end portion of the second power connection line may be ends of the respective first power connection line and the second power connection line that are nearest to the display area.

The display apparatus may further include a plurality of pixels arranged in the display area and a common electrode on the plurality of pixels. The power transmission line may extend along the first edge and may be electrically connected to the common electrode.

The display apparatus may further include a plurality of driving power lines extending in the first direction into the display area. The power transmission line may extend along the second edge and may be electrically connected to the plurality of driving power lines.

The display apparatus may further include: a first power connection additional line under the first power connection line and having a portion overlapping the first power connection line when viewed in a direction perpendicular to the substrate; and a second power connection additional line under the second power connection line and having a portion overlapping the second power connection line when viewed in the direction perpendicular to the substrate. The power input line may be electrically connected to a $1^{st}$-$1^{st}$ additional end portion of the first power connection additional line and a $2^{nd}$-$1^{st}$ additional end portion of the second power connection additional line. The $1^{st}$-$1^{st}$ additional end portion of the first power connection additional line and the $2^{nd}$-$1^{st}$ additional end portion of the second power connection additional line may be ends of the first power connection additional line and the second power connection additional line that are farthest from the display area.

When viewed in the direction perpendicular to the substrate, the $1^{st}$-$1^{st}$ additional end portion may be nearer to the second edge than the $1^{st}$-$1^{st}$ end portion is, and the $2^{nd}$-$1^{st}$ additional end portion may be nearer to the second edge than the $2^{nd}$-$1^{st}$ end portion is.

The display apparatus may further include a plurality of second power connection lines arranged between the plurality of data transmission lines and extending in the first direction. The power input line may be electrically connected to a $2^{nd}$-$1^{st}$ end portion of each of the plurality of second power connection lines, and the $2^{nd}$-$1^{st}$ end portion of each of the plurality of second power connection lines may be farthest from the display area.

The display apparatus may further include a thin-film transistor in the display area and including a gate electrode, a semiconductor layer, and at least one of a source electrode and a drain electrode. The first power connection line and the gate electrode may be on a same layer.

The first power connection line and the gate electrode may include a first metal layer and a second metal layer on the first metal layer.

The first metal layer may include titanium or aluminum, and the second metal layer may include molybdenum.

The display apparatus may further include: a display element in the display area; and an encapsulation layer covering the display element and including an inorganic encapsulation layer and an organic encapsulation layer on the inorganic encapsulation layer. The inorganic encapsulation layer may be in direct contact with the first power connection line or an insulating layer covering the first power connection line, and the inorganic encapsulation layer may include an inorganic material.

Aspects and features of the present disclosure, other than those described above, will become apparent from the following detailed description, claims, and drawings that follow.

BRIEF DESCRIPTION OF THE DRAWINGS

The above and other aspects and features of the present disclosure will be more apparent from the following description, taken in conjunction with the accompanying drawings, in which.

DETAILED DESCRIPTION

Figure 1:
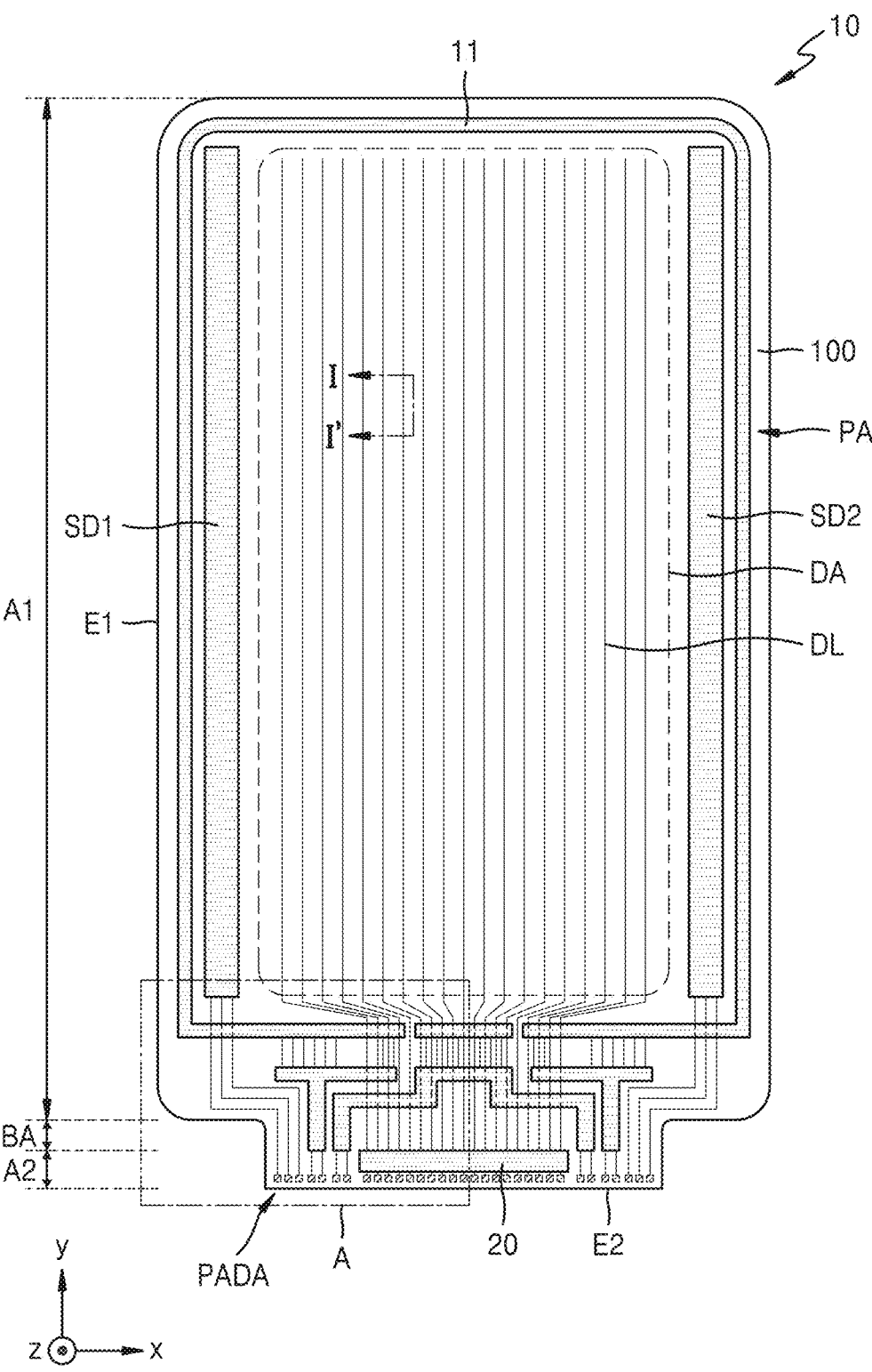
FIG. 1 is a schematic plan view of a portion of a display apparatus according to an embodiment.

Reference will now be made, in detail, to embodiments, examples of which are illustrated in the accompanying drawings. The described embodiments may have different forms and should not be construed as being limited to the descriptions set forth herein. Accordingly, embodiments are merely described below, by referring to the figures, to explain aspects and features of the present description.

Because the disclosure allows for various changes and numerous embodiments, some embodiments will be shown in the drawings and described in detail in the written description. The attached drawings illustrate embodiments of the present disclosure to provide a sufficient understanding of the aspects and features of the present disclosure. The present disclosure may, however, be embodied in many different forms and should not be construed as being limited to the embodiments set forth herein.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. As used herein, the terms "use," "using," and "used" may be considered synonymous with the terms "utilize,"

"utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly. The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

In the following examples, the x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

FIG. 1 is a schematic plan view of a portion of a display apparatus according to an embodiment.

Referring to FIG. 1, the display apparatus according to an embodiment may include a display panel 10. The display apparatus including the display panel 10 may be any type of display apparatus. For example, the display apparatus may be various products, such as a smartphone, a tablet computer, a laptop, a television, or a billboard.

The display panel 10 has a display area DA, where pixels are arranged, and a peripheral area PA outside (e.g., around a periphery of) the display area DA. A substrate 100 included in the display apparatus has (or defines) the display area DA and the peripheral area PA. The peripheral area PA includes a pad area PADA, which is an area where an electronic component, such as a driving chip 20, a printed circuit board, or the like, is electrically attached. A first scan driving circuit SD1, a second scan driving circuit SD2, a common voltage supply line 11, and the like may also be arranged in the peripheral area PA.

The driving chip 20 may include an integrated circuit for driving the display panel 10. Such an integrated circuit may be a data driving integrated circuit for generating a data signal, but the present disclosure is not limited thereto. The driving chip 20 may be mounted in the peripheral area PA adjacent to a second edge E2 of the substrate 100.

FIG. 1 may be understood as a plan (or plane) view showing a substrate and other components during a step of manufacturing the display apparatus. In a finished display apparatus or an electronic apparatus including the display apparatus, such as a smartphone, a portion of the substrate may be bent to reduce an area of the peripheral area PA which is recognized by a user. For example, the peripheral area PA may have a bending area BA, and the bending area BA may be between the pad area PADA and the display area DA. In such an embodiment, the substrate 100 is bent at the bending area BA, and a first area A1 may overlap a second area A2 such that, with respect to the bending area BA, the first area A1 is located on one side of the substrate 100 and the second area A2 is located on the other side (e.g., below) thereof. For example, when the substrate 100 is bent at the bending area BA, at least a portion of the pad area PADA may overlap the display area DA. In such an embodiment, the bending area BA is bent in a direction such that the pad area PADA is located on (or under) a rear side of the display area DA instead of covering (or being on a same plane as) the display area DA. Accordingly, to the user, the display area DA appears to occupy most of the display apparatus while the size of the peripheral area PA visible to the user is reduced or minimized. Although the driving chip 20 is mounted on the same surface as a display surface of the display area DA, because the display panel 10 is bent at the bending area BA, the driving chip 20 may be disposed on a rear surface of the display area DA.

The substrate 100 may include various materials that are flexible or bendable, and examples of such materials include polymer resin, such as polyether sulfone, polyacrylate, polyether imide, polyethylene naphthalate, polyethylene terephthalate, polyphenylene sulfide, polyarylate, polyimide, polycarbonate, or cellulose acetate propionate. Various modifications may be made to the substrate 100, and for example, the substrate 100 may have a multilayer structure that includes at least two layers including the above polymer resin and a barrier layer including an inorganic material (e.g., silicon oxide, silicon nitride, silicon oxynitride, or the like) arranged between the two polymer resin layers. Furthermore, when the substrate 100 is not intended to be bent, the substrate 100 may include glass or the like.

Edges of the display area DA may form shapes that are similar to a rectangle or a square overall. Accordingly, the substrate 100 may also have a shape similar to a rectangle or a square overall. The edges of the display area DA may form circular, oval, or polygonal shapes.

As shown in FIG. 1, the substrate 100 may have a first edge E1 extending in a first direction (e.g., a y-axis direction) and a second edge E2 extending in a second direction (e.g., an x-axis direction) crossing the first direction. The pad area PADA may be adjacent to the second edge E2 of the peripheral area PA of the substrate 100. In some embodiments, the substrate 100 may have a bent portion between the first edge E1 and the second edge E2, and thus, the substrate 100 may be easily bent at the bending area BA. As shown in FIG. 1, a width of the second area A2 of the substrate 100 in the second direction (e.g., the x-axis direction) may be less than a width of the first area A1 of the substrate 100 in the second direction.

Hereinafter, an organic light-emitting display apparatus is described as an example of the display apparatus, but the display apparatus is not limited thereto. As another example, the display apparatus may be a display apparatus, such as an inorganic light-emitting display apparatus, an inorganic EL display apparatus, or a quantum dot light-emitting display apparatus. For example, an emission layer of a display element of the display apparatus may include an organic material or an inorganic material. Also, the display apparatus may include an emission layer and quantum dots arranged along a path of light emitted from the emission layer.

Pixels are arranged in the display area DA. Each of the pixels may be a sub-pixel and may include a display element, such as an organic light-emitting diode OLED, and a pixel circuit electrically connected to the display element. The pixel may be configured to emit, for example, red light, green light, blue light, or white light. The pixels may be electrically connected to outer circuits arranged in the peripheral area PA. The first scan driving circuit SD1, the second scan driving circuit SD2, and the common voltage supply line 11 may be arranged in the peripheral area PA.

The first scan driving circuit SD1 may extend along the first edge E1 of the substrate 100. The first scan driving circuit SD1 may be configured to provide a scan signal to the pixels through a scan line extending into the display area DA in the second direction (e.g., the x-axis direction). The second scan driving circuit SD2 may be arranged symmetrically to the first scan driving circuit SD1 with the display area DA therebetween. Some of the pixels arranged in the display area DA may be electrically connected to the first scan driving circuit SD1, and the others of the pixels may be electrically connected to the second scan driving circuit SD2. In some embodiments, the second scan driving circuit SD2 may be omitted, and all of the pixels arranged in the display area DA may be electrically connected to the first scan driving circuit SD1.

An emission control driving circuit may be arranged at a side of the first scan driving circuit SD1 or the second scan driving circuit SD2 in addition to the aforementioned components, and an emission control signal may be provided to the pixels through an emission control line substantially parallel to a scan line.

A plurality of pads PD1, PD2, PD3, and PD4 (see, e.g., FIG. 2) may be arranged in the pad area PADA of the display panel 10. The pads PD1 to PD4 may not be covered by an insulating layer (e.g., may be exposed through the insulating layer) and, thus, may be electrically connected to a printed circuit board. For example, pads of the printed circuit board may be electrically connected to the pads PD1 to PD4 of the display panel 10.

The printed circuit board may be configured to transmit a signal or power from a controller to the display panel 10. Control signals generated by the controller may be transmitted to the driving chip 20, the first scan driving circuit SD1, the second scan driving circuit SD2, and the like through the printed circuit board. Also, the controller may provide a common voltage ELVSS to the common voltage supply line 11 and a driving voltage ELVDD to driving power lines extending in the first direction (e.g., the y-axis direction) into the display area DA, which is described below in more detail.

The common voltage supply line 11 may have a loop shape with one open side to partially surround (e.g., to partially surround in a plan view or to extend partially around a periphery of) the display area DA.

The controller may generate a data signal, and the generated data signal may be transmitted to the pixel through the driving chip 20 and the data line DL.

Figure 2:
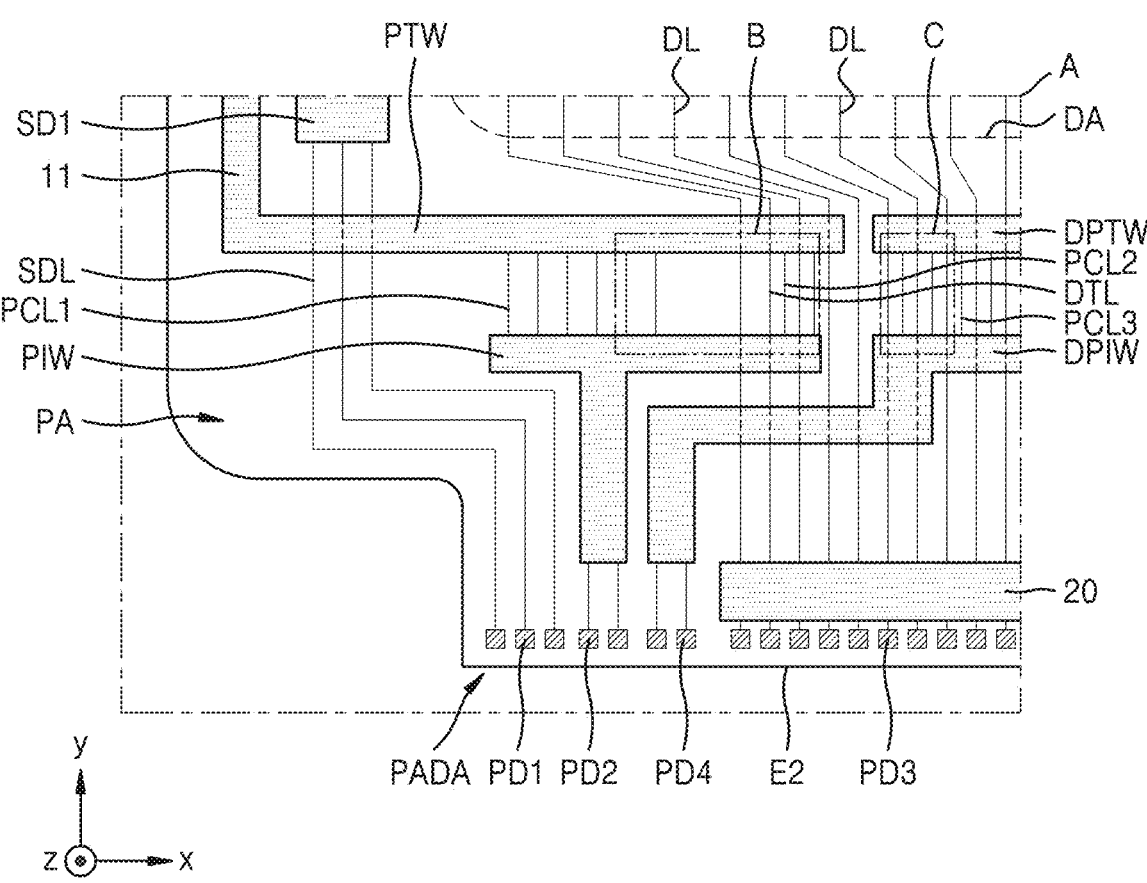
FIG. 2 is a conceptual view of the enlarged region A in FIG. 1.
Figure 3:
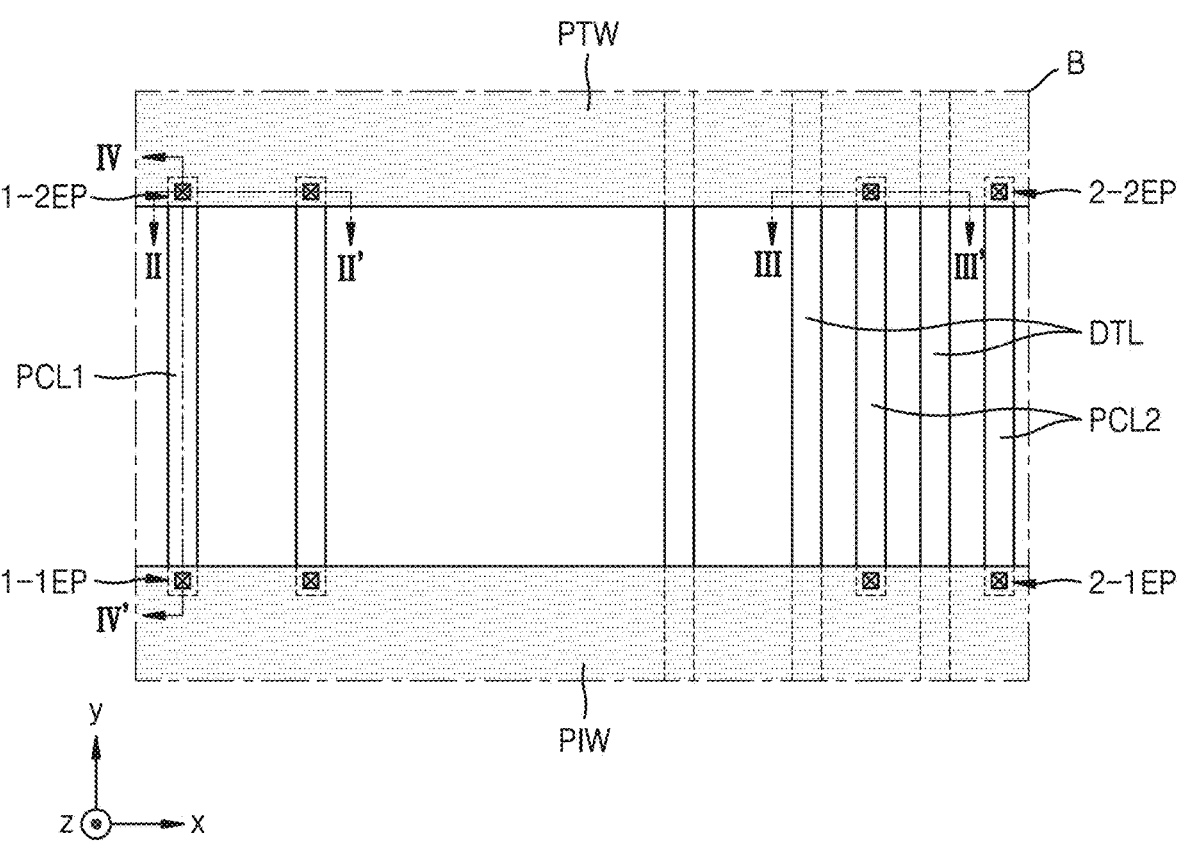
FIG. 3 is a conceptual view of the enlarged region B in FIG. 2.
Figure 4:
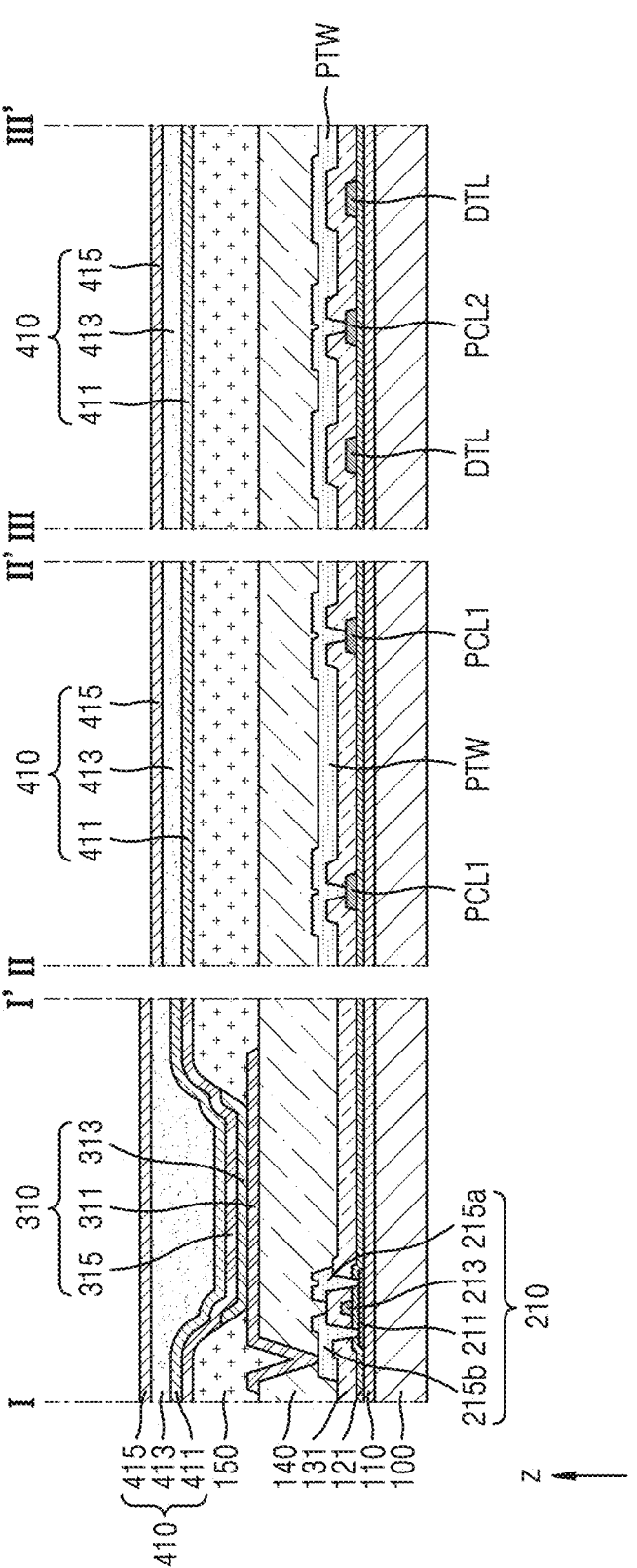
FIG. 4 is a schematic cross-sectional view of the display apparatus taken along the line I-I' in FIG. 1, the line II-II' in FIG. 3, and the line III-III' in FIG. 3.
Figure 5:
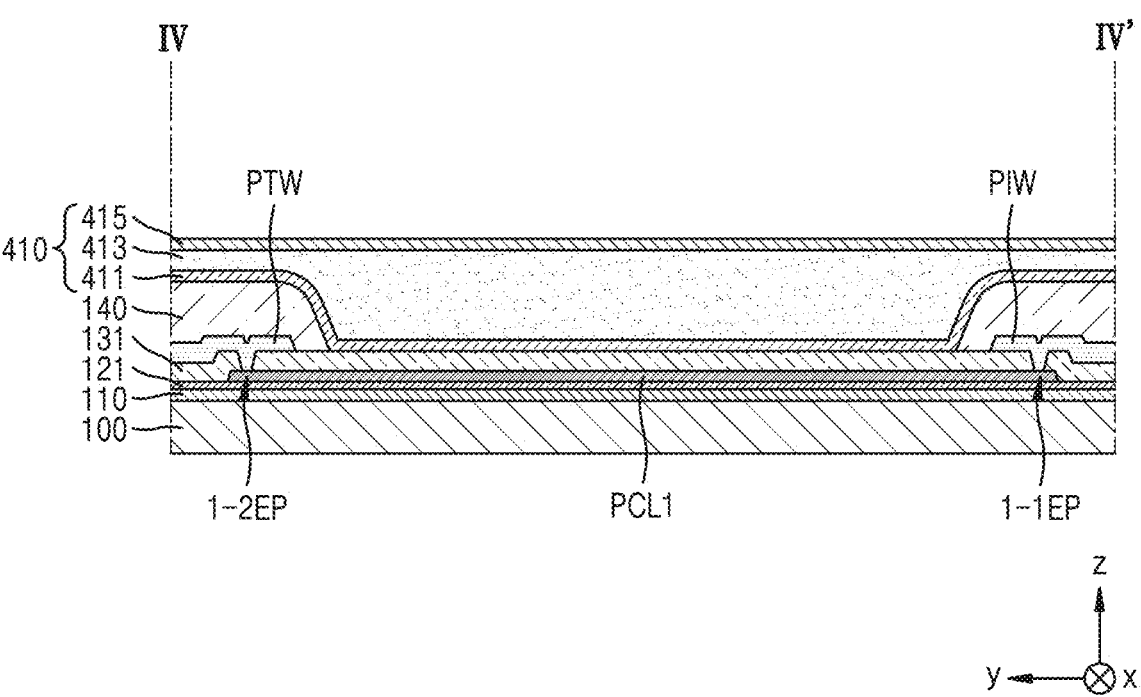
FIG. 5 is a schematic cross-sectional view of the display apparatus taken along the line IV-IV' in FIG. 3.
Figure 6:
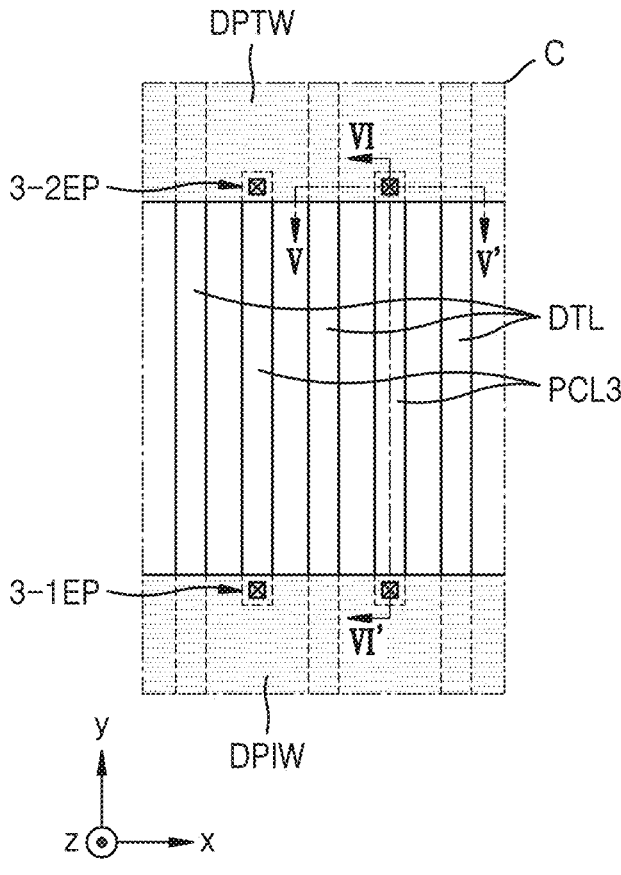
FIG. 6 is a conceptual view of the enlarged region C in FIG. 2.
Figure 7:
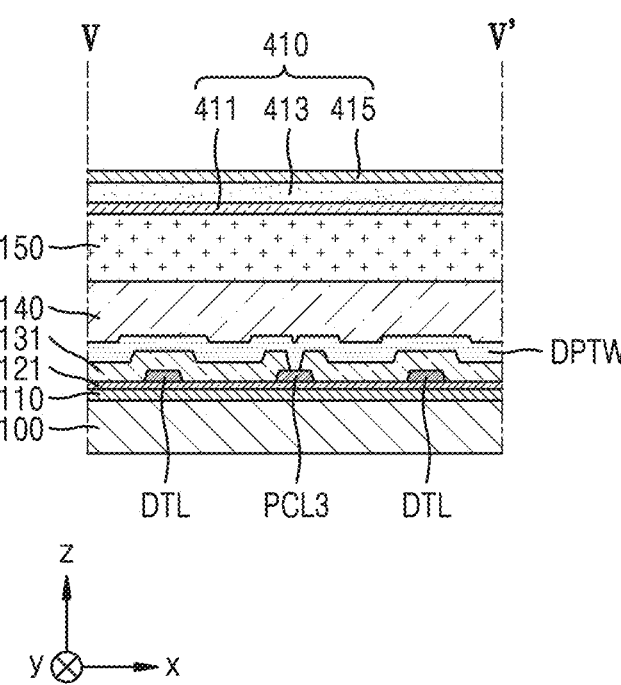
FIG. 7 is a schematic cross-sectional view of the display apparatus taken along the line V-V' in FIG. 6.
Figure 8:
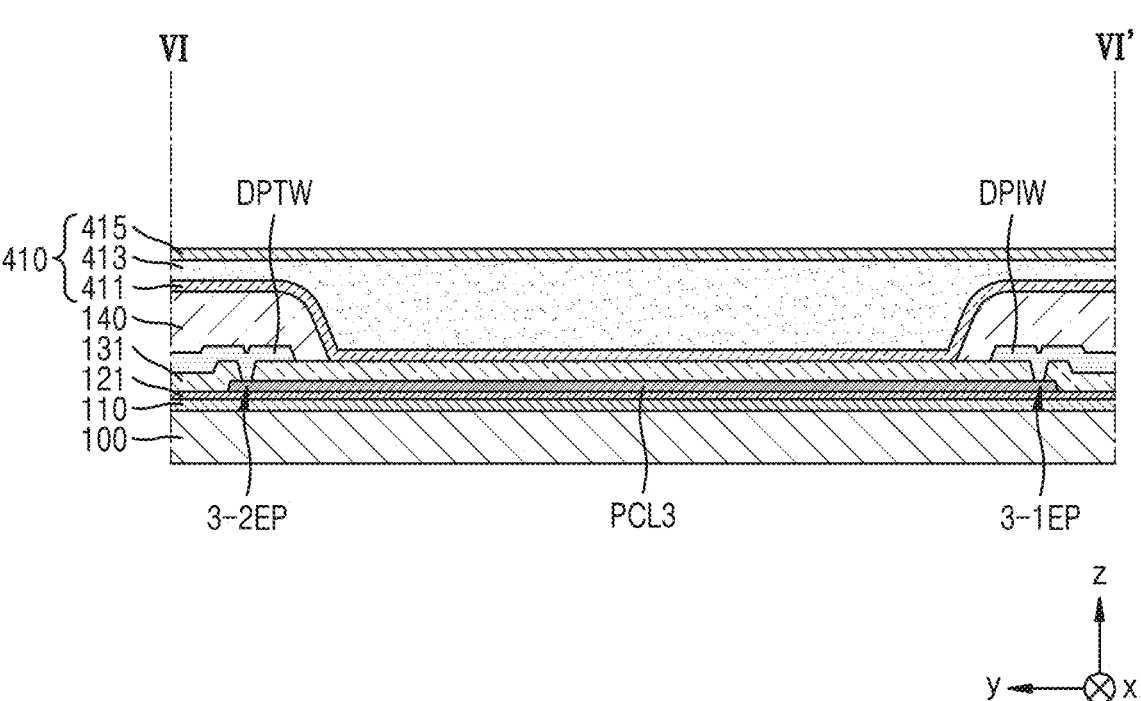
FIG. 8 is a schematic cross-sectional view of the display apparatus taken along the line VI-VI' in FIG. 6.

FIG. 2 is a conceptual view of the enlarged region A in FIG. 1, FIG. 3 is a conceptual view of the enlarged region B in FIG. 2, FIG. 4 is a schematic cross-sectional view of the display apparatus taken along the line I-I' in FIG. 1, the line II-II' in FIG. 3, and the line III-III' in FIG. 3, FIG. 5 is a schematic cross-sectional view of the display apparatus taken along the line IV-IV' in FIG. 3, FIG. 6 is a conceptual view of the enlarged region C in FIG. 2, FIG. 7 is a schematic cross-sectional view of the display apparatus taken along the line V-V' in FIG. 6, and FIG. 8 is a schematic cross-sectional view of the display apparatus taken along the line VI-VI' in FIG. 6.

As shown in FIG. 2, a first pad PD1, a second pad PD2, a third pad PD3, a fourth pad PD4, etc. may be located near the second edge E2 of the substrate 100.

A scan driving circuit line SDL may be in the peripheral area PA adjacent to the second edge E2 and electrically connected to the first scan driving circuit SD1 and the first pad PD1. Accordingly, a control signal, which is input from the printed circuit board through the first pad PD1, may be transmitted to the first scan driving circuit SD1 through the scan driving circuit line SDL.

A power input line PIW located in the peripheral area PA adjacent to the second edge E2 of the substrate 100 may have a first portion extending in the second direction (e.g., the x-axis direction) and a second portion protruding from the first portion and extending in the first direction (e.g., the y-axis direction). The second portion may be electrically connected to the second pad PD2. A power transmission line PTW extending in the second direction (e.g., the x-axis direction) and substantially parallel to the first portion of the power input line PIW may have a side (e.g., an end) connected to the common voltage supply line 11. The power transmission line PTW may be integrally formed as a single body with the common voltage supply line 11.

A first power connection line PCL1 may be adjacent to the second edge E2 in the peripheral area PA between the second edge E2 (e.g., the center of the second edge E2) and the scan driving circuit line SDL. The first power connection line PCL1 may have a shape extending in the first direction (e.g., the y-axis direction) to electrically connect the power input line PIW to the power transmission line PTW. For example, as shown in FIGS. 3 and 5, a $1^{st}$-$1^{st}$ end portion 1-1EP of the first power connection line PCL1 in a direction (e.g., a −y direction) away from the display area DA may be disposed under the power input line PIW and may be electrically connected to the power input line PIW through a contact hole (e.g., a contact opening) defined in an insulating layer disposed over the first power connection line PCL1. As shown in FIGS. 3, 4, and 5, a $1^{st}$-$2^{nd}$ end portion 1-2EP of the first power connection line PCL1 in the direction towards the display area DA (e.g., a +y direction) may be disposed under the power transmission line PTW and electrically connected to the power transmission line PTW through a contact hole (e.g., a contact opening) defined in the insulating layer disposed over the first power connection line PCL1. Accordingly, the common voltage ELVSS, which is input from the printed circuit board through the second pad PD2, may be transmitted to the common voltage supply line 11 through the power input line PIW, the first power connection line PCL1, and the power transmission line PTW, and as a result, the common voltage ELVSS may be applied to a common electrode (e.g., 315 in FIG. 4) electrically connected to the common voltage supply line 11.

Data signals of the controller, which are input from the printed circuit board through the third pad PD3, may be transmitted to the data lines DL in the display area DA through the driving chip 20 and data transmission lines DTL and finally transmitted to the pixels. The data transmission lines DTL may be, for example, adjacent to the second edge E2 of the substrate 100 in the peripheral area PA between the second edge E2 (e.g., the center of the second edge E2) and the first power connection line PCL1. Each data transmission line DTL may extend in the first direction (e.g., the y-axis direction).

As shown in FIG. 2, a second power connection line PCL2 may be located between the data transmission lines DTL. The second power connection line PCL2 may extend in the first direction (e.g., the y-axis direction) to electrically connect the power input line PIW to the power transmission line PTW. For example, as shown in FIG. 3, a $2^{nd}$-$1^{st}$ end portion 2-1EP of the second power connection line PCL2 in the direction (e.g., the $-y$ direction) away from the display area DA may be under the power input line PIW and may be electrically connected to the power input line PIW through a contact hole (e.g., a contact opening) defined in an insulating layer disposed over the second power connection line PCL2. As shown in FIGS. 3 and 4, a $2^{nd}$-$2^{nd}$ end portion 2-2EP of the second power connection line PCL2 in the direction towards the display area DA (e.g., the $+y$ direction) may be disposed under the power transmission line PTW and electrically connected to the power transmission line PTW through the contact hole (e.g., a contact opening) defined in the insulating layer disposed over the second power connection line PCL2. Accordingly, the common voltage ELVSS, which is input from the printed circuit board through the second pad PD2, may be transmitted to the common voltage supply line 11 through the power input line PIW, the second power connection line PCL2, and the power transmission line PTW, and as a result, the common voltage ELVSS may be applied to the common electrode (e.g., 315 in FIG. 4) electrically connected to the common voltage supply line 11.

The power input line PIW may be electrically connected to the power transmission line PTW through not only the first power connection line PCL1 but also the second power connection line PCL2. Accordingly, the common voltage ELVSS may be effectively transmitted from the power input line PIW to the power transmission line PTW.

The width of the first power connection line PCL1 when viewed in a direction perpendicular to the substrate 100 (e.g., a z-axis direction) may be increased or the number of first power connection lines PCL1 may be increased. However, because the first power connection line PCL1, the scan driving circuit line SDL, and the data transmission line DTL are disposed on the same layer, it may not be easy to increase the width of the first power connection line PCL1 or the number of first power connection lines PCL1. In the display apparatus according to the illustrated embodiment, the second power connection line PCL2, which is located between the data transmission lines DTL and electrically connects the power input line PIW to the power transmission line PTW, is included, and thus, the common voltage ELVSS may be effectively transmitted from the power input line PIW to the power transmission line PTW. Because the second power connection line PCL2 and the data transmission line DTL are disposed on the same layer, the second power connection line PCL2 may be located between the data transmission lines DTL and may have an isolated shape.

As shown in FIG. 2, a plurality of second power connection lines PCL2 may be located between the data transmission lines DTL. FIG. 2 shows an embodiment in which the display apparatus includes two second power connection lines PCL2, but this is merely an example. The display apparatus may include a greater number of second power connection lines PCL2, which is also applied to the embodiments below and modified examples.

A driving power input line DPIW located in the peripheral area PA adjacent to the second edge E2 of the substrate 100 may have a first portion extending in the second direction (e.g., the x-axis direction) and a second portion protruding from the first portion, extending in the first direction (e.g., the y-axis direction), and bent multiple times. The second portion may be electrically connected to the fourth pad PD4. A driving power transmission line DPTW extending in the second direction (e.g., the x-axis direction) and substantially parallel with the first portion of the driving power input line DPIW may be electrically connected to driving power lines extending in the first direction (e.g., the y-axis direction) into the display area DA. The driving power lines may be substantially parallel with the data lines DL.

A third power connection line PCL3 may have a shape extending in the first direction (e.g., the y-axis direction) to electrically connect the driving power input line DPIW to the driving power transmission line DPTW. For example, as shown in FIGS. 6 and 8, a $3^{rd}$-$1^{st}$ end portion 3-1EP of the third power connection line PCL3 in the direction (e.g., the $-y$ direction) away from the display area DA may be disposed under the driving power input line DPIW and may be electrically connected to the driving power input line DPIW through a contact hole (e.g., a contact opening) defined in an insulating layer disposed over the third power connection line PCL3. As shown in FIGS. 6, 7, and 8, a $3^{rd}$-$2^{nd}$ end portion 3-2EP of the third power connection line PCL3 in the direction towards the display area DA (e.g., the $+y$ direction) may be disposed under the driving power transmission line DPTW and electrically connected to the driving power transmission line DPTW through a contact hole (e.g., a contact opening) defined in the insulating layer disposed over the third power connection line PCL3. Accordingly, the driving voltage ELVDD, which is input from the printed circuit board through the fourth pad PD4, may be transmitted to the driving power lines through the driving power input line DPIW, the third power connection line PCL3, and the driving power transmission line DPTW, and as a result, the driving voltage ELVDD may be applied to each pixel electrically connected to the driving power line.

As shown in FIG. 4, the display apparatus according to the illustrated embodiment may include a display element, such as an organic light-emitting diode 310, located in the display area DA and a thin-film transistor 210 located in the display area DA, electrically connected to the organic light-emitting diode 310, and controlling the emission or an emission degree (or amount) of the organic light-emitting diode 310. The electrical connection of the organic light-emitting diode 310 to the thin-film transistor 210 may be understood as the electrical connection of a pixel electrode 311 of the organic light-emitting diode 310 to the thin-film transistor 210.

The thin-film transistor 210 may include a semiconductor layer 211 including amorphous silicon, polycrystalline silicon, or an organic semiconductor material, a gate electrode 213, a source electrode 215a, and a drain electrode 215b. The gate electrode 213 may include various conductive materials and may have a variety of layer structures. For example, the gate electrode 213 may include a molybdenum (Mo) layer and an aluminum (Al) layer. The gate electrode 213 may include a first metal layer including titanium (Ti)

or Al and a second metal layer disposed on the first metal layer and including Mo. The source electrode 215a and the drain electrode 215b may also include various conductive materials and may have various layer structures. For example, the source electrode 215a and the drain electrode 215b may include a Ti layer and an Al layer. In detail, the source electrode 215a and the drain electrode 215b may include a first metal layer including Ti, a second metal layer disposed on the first metal layer and including Al, and a third metal layer disposed on the second metal layer and including Ti.

To insulate the semiconductor layer 211 from the gate electrode 213, a gate insulating layer 121, which includes an inorganic material, such as silicon oxide, silicon nitride, and/or silicon oxynitride, may be arranged between the semiconductor layer 211 and the gate electrode 213. In addition, an interlayer insulating layer 131, which includes an inorganic material, such as silicon oxide, silicon nitride, and/or silicon oxynitride, may be disposed over the gate electrode 213, and the source electrode 215a and the drain electrode 215b may be disposed over the interlayer insulating layer 131. An insulating layer including an inorganic material may include silicon oxide, silicon nitride, or silicon oxynitride formed through chemical vapor deposition (CVD) or atomic layer deposition (ALD), which is also applied to the embodiments below and modified examples.

For reference, the source electrode 215a and the drain electrode 215b may not act as electrodes and may just be metal layers. For example, a portion of the semiconductor layer 211 may be doped to act as a source electrode or a drain electrode, and in such an embodiment, the source electrode 215a or the drain electrode 215b shown in FIG. 4 may be understood to be a connection electrode to electrically connect a semiconductor layer to other components. In other embodiments, the source electrode 215a or the drain electrode 215b may be a portion of a line, and various modifications may be made thereto; for example, the source electrode 215a or the drain electrode 215b may not contact the semiconductor layer 211. In such an embodiment, the source electrode 215a or the drain electrode 215b may be a metal layer located in the display area DA, which is also applied to the embodiments below and modified examples.

The thin-film transistor 210 does not necessarily include both the source electrode 215a and the drain electrode 215b. Because a pixel circuit electrically connected to the organic light-emitting diode 310 may include thin-film transistors and a capacitor, when a drain electrode of one thin-film transistor is connected to a source electrode of another thin-film transistor, the thin-film transistor does not include the drain electrode and the other thin-film transistor does not include the source electrode. In this case, a drain area of a semiconductor layer of the thin-film transistor may be integrally formed as a single body with a source area of a semiconductor layer of the other thin-film transistor.

A buffer layer 110, which includes an inorganic material, such as silicon oxide, silicon nitride, and/or silicon oxynitride, may be arranged between the thin-film transistor 210 including the above structure and the substrate 100. The buffer layer 110 may improve the flatness of (e.g., may planarize) the upper surface of the substrate 100 or may prevent or reduce penetration of impurities from the substrate 100 to the semiconductor layer 211 of the thin-film transistor 210.

A planarization layer 140 may be disposed over the thin-film transistor 210. For example, as shown in FIG. 4, when the organic light-emitting diode 310 is disposed over the thin-film transistor 210, the planarization layer 140 may cover the thin-film transistor 210 disposed thereunder and may have a substantially flat upper surface. The planarization layer 140 may include, for example, an organic material, such as an acryl, benzocyclobutene (BCB), or hexamethyldisiloxane (HMDSO). FIG. 4 shows that the planarization layer 140 is a single layer, but the planarization layer 140 may include multiple layers.

A display element may be disposed over the planarization layer 140 in the display area DA of the substrate 100. FIG. 4 shows that the organic light-emitting diode 310 is disposed over the planarization layer 140 as a display element. The organic light-emitting diode 310 may include the pixel electrode 311, the opposite electrode (e.g., the common electrode) 315, and an intermediate layer 313 arranged therebetween and including an emission layer. As shown in FIG. 4, the pixel electrode 311 may contact either the source electrode 215a or the drain electrode 215b through an opening formed in the planarization layer 140 (and any other intervening layers) and may be electrically connected to the thin-film transistor 210. The pixel electrode 311 includes a light-transmissive conductive layer including light-transmissive conductive oxide, such as ITO, $In_2O_3$, or IZO, and a reflection layer including metal, such as Al or Ag. For example, the pixel electrode 311 may have a three-layer structure of ITO/Ag/ITO.

A pixel-defining layer 150 may be disposed over the planarization layer 140. The pixel-defining layer 150 may have an opening corresponding to each sub-pixel, that is, an opening exposing at least a central portion of the pixel electrode 311, to define the pixels. Also, as shown in FIG. 4, the pixel-defining layer 150 may increase a distance between an edge of the pixel electrode 311 and the opposite electrode 315 over the pixel electrode 311 to prevent arcs from being generated at the edge of the pixel electrode 311. The pixel-defining layer 150 may include, for example, an organic material, such as polyimide or HMDSO.

The intermediate layer 313 of the organic light-emitting diode may include a low-molecular-weight material or a high-molecular-weight material. When the intermediate layer 313 includes a low-molecular-weight material, the intermediate layer 313 may have a structure in which a hole injection layer (HIL), a hole transport layer (HTL), an emission layer (EML), an electron transport layer (ETL), and an electron injection layer (EIL) are stacked in a single or complex structure and may be formed through vacuum deposition. When the intermediate layer 313 includes a high-molecular-weight material, the intermediate layer 313 may have a structure including an HTL and an EML. The intermediate layer 313 may be formed according to a screen printing method, an inkjet printing method, a Laser Induced Thermal Imaging (LITI) method, or the like. However, the intermediate layer 313 is not limited thereto and may have various structures. The intermediate layer 313 may include a layer integrally formed as a single body over the pixel electrodes 311 or may be a layer patterned to correspond to each of the pixel electrodes 311.

The opposite electrode 315 may be disposed over the display area DA and may cover the display area DA. For example, the opposite electrode 315 may be integrally formed as a single body over a plurality of organic light-emitting diodes and may correspond to the pixel electrodes 311. The opposite electrode 315 may include a light-transmissive conductive layer including ITO, $In_2O_3$, or IZO and a semi-transmissive metal layer including metal, such as Al or Ag. For example, the opposite electrode 315 may include a semi-transmissive layer including MgAg. The opposite electrode 315 may cover the display area DA and may extend to the peripheral area PA outside the display area DA. For example, the opposite electrode 315 may be electrically connected to the common voltage supply line 11, described above. The common voltage ELVSS may be applied to the opposite electrode 315. The opposite electrode 315 may be electrically connected to the power transmission line PTW.

The first power connection line PCL1, the second power connection line PCL2, the third power connection line PCL3, and the data transmission line DTL, described above, may be disposed over the gate insulating layer 121, similar to the gate electrode 213, as shown in FIGS. 4 and 7. During the manufacture, the first power connection line PCL1, the second power connection line PCL2, the third power connection line PCL3, and the data transmission line DTL may be concurrently (or simultaneously) formed of the same material as the gate electrode 213 and, thus, may have the same layer structure as the gate electrode 213. For example, the first power connection line PCL1, the second power connection line PCL2, the third power connection line PCL3, and the data transmission line DTL may include the first metal layer including Al or Ti and the second metal layer disposed on the first metal layer and including Mo.

The power transmission line PTW, the power input line PIW, the driving power transmission line DPTW, and the driving power input line DPIW may be disposed over the interlayer insulating layer 131, similar to the source electrode 215a and the drain electrode 215b, as shown in FIGS. 4, 5, 7, and 8. During the manufacture, the power transmission line PTW, the power input line PIW, the driving power transmission line DPTW, and the driving power input line DPIW may be concurrently (or simultaneously) formed of the same material as the source electrode 215a or the drain electrode 215b and, thus, may have the same layer structure as the source electrode 215a or the drain electrode 215b. For example, the power transmission line PTW, the power input line PIW, the driving power transmission line DPTW, and the driving power input line DPIW may include the first metal layer including Ti, the second metal layer disposed on the first metal layer and including Al, and the third metal layer disposed on the second metal layer and including Ti.

As shown in FIG. 4, the display apparatus may include an encapsulation layer 410. The encapsulation layer 410 may cover the display element, such as the organic light-emitting diode 310, and may include a first inorganic encapsulation layer 411, an organic encapsulation layer 413 disposed over the first inorganic encapsulation layer 411, and a second inorganic encapsulation layer 415 disposed over the organic encapsulation layer 413. The first inorganic encapsulation layer 411 and the second inorganic encapsulation layer 415 may each include silicon oxide, silicon nitride, or silicon oxynitride.

As shown in FIGS. 5 and 8, the planarization layer 140 including an organic material may have an opening extending in the second direction (e.g., the x-axis direction) such that the interlayer insulating layer 131, which is an inorganic material layer disposed under the planarization layer 140, is exposed. Accordingly, the first inorganic encapsulation layer 411 of the encapsulation layer 410 may directly contact the interlayer insulating layer 131, that is the inorganic material layer. The first inorganic encapsulation layer 411 of the encapsulation layer 410 adheres to a layer including an inorganic material better (e.g., more strongly) than the first inorganic encapsulation layer 411 adheres to a layer including an organic material. Therefore, the planarization layer 140 including the organic material has an opening extending in the second direction (e.g., the x-axis direction) such that the first inorganic encapsulation layer 411 of the encapsulation layer 410 directly contacts the interlayer insulating layer 131, that is the inorganic material layer, and thus, the encapsulation layer 410 may strongly adhere to a layer thereunder. The first power connection line PCL1, the second power connection line PCL2, and the third power connection line PCL3 may each be an inorganic material layer including metal, and thus, the first inorganic encapsulation layer 411 of the encapsulation layer 410 may directly contact the inorganic material layer including the metal.

Because the power input line PIW or the power transmission line PTW may also be an inorganic material layer including the metal, the power input line PIW may be directly connected to the power transmission line PTW through the first power connection line PCL1 and the second power connection line PCL2, and the first inorganic encapsulation layer 411 of the encapsulation layer 410 may directly contact the power input line PIW and the power transmission line PTW. However, as described above, the power input line PIW and the power transmission line PTW are concurrently (or simultaneously) formed of the same material as the source electrode 215a or the drain electrode 215b, and thus, when the power input line PIW and the power transmission line PTW have a three-layer structure of Ti/Al/Ti, because Al has a higher etch rate than Ti, a tip, which is a part of an uppermost layer of a Ti layer that protrudes outside an Al layer, may be formed. During the manufacture, such a tip may be separated from the power input line PTW or the power transmission line PTW and may contact another conductive layer, which may cause defects in the display apparatus.

In a display apparatus according to embodiments of the present disclosure, the power input line PIW and the power transmission line PTW are covered by the planarization layer 140 right after (e.g., immediately after) being formed during manufacture. The power input line PIW and the power transmission line PTW are electrically connected to each other by the first power connection line PCL1 and the second power connection line PCL2 disposed thereunder. Therefore, the occurrence of defects during manufacture is reduced or prevented, and the encapsulation effect may be improved by forming the first inorganic encapsulation layer 411 to be in direct contact with the first power connection line PCL1 or the second power connection line PCL2, which is an inorganic layer, or by forming the first inorganic encapsulation layer 411 to be in direct contact with the interlayer insulating layer 131, which covers the first power connection line PCL1 or the second power connection line PCL2 and is an inorganic layer.

Figure 9:
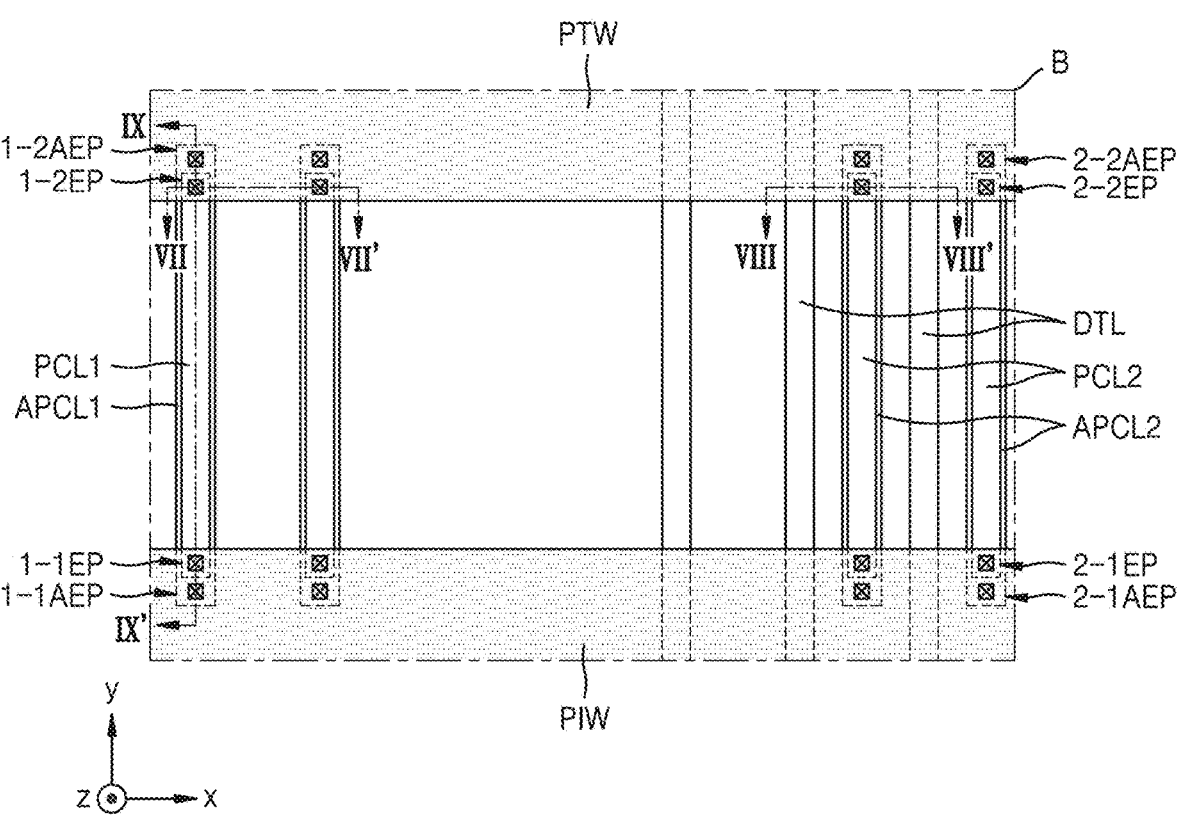
FIG. 9 is a schematic conceptual view of a portion of a display apparatus according to an embodiment.
Figure 10:
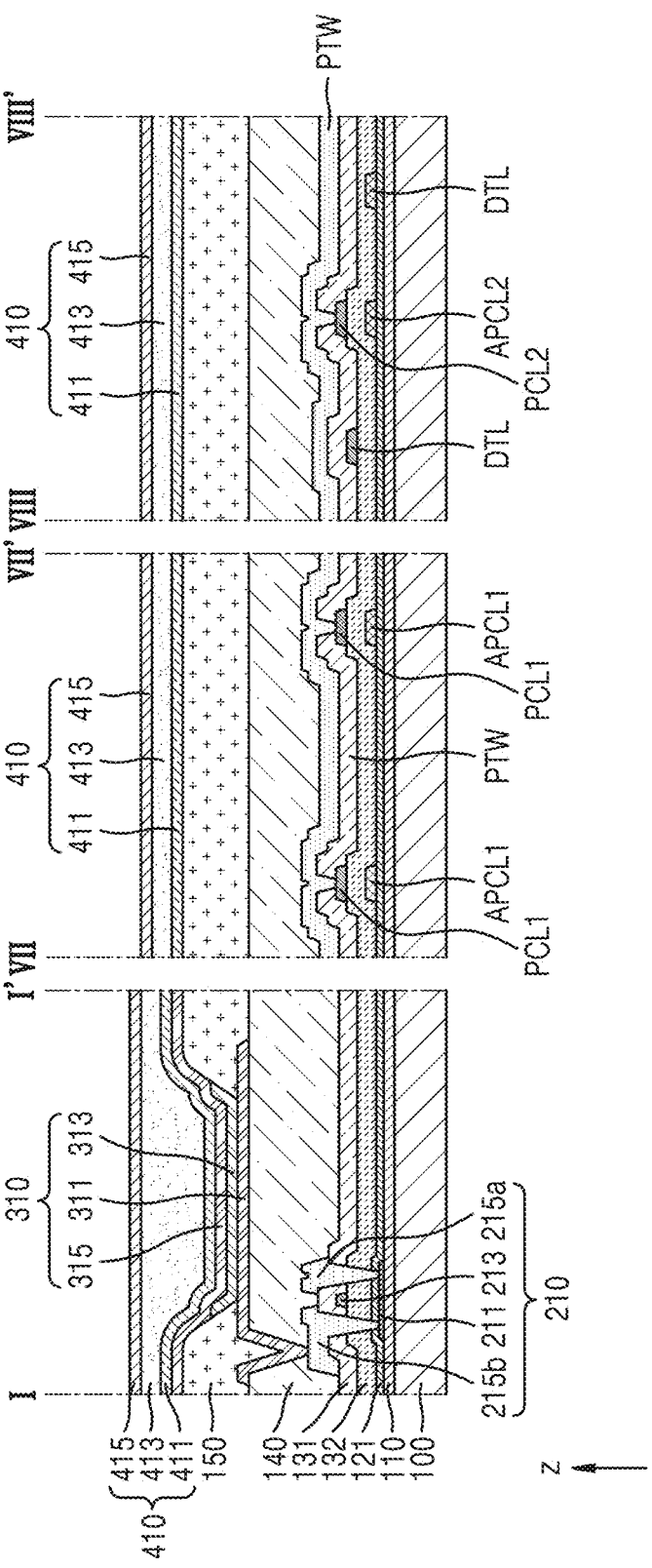
FIG. 10 is a schematic cross-sectional view of the display apparatus taken along the line I-I' in FIG. 1, the line VII-VII' in FIG. 9, and the line VIII-VIII' in FIG. 9.
Figure 11:
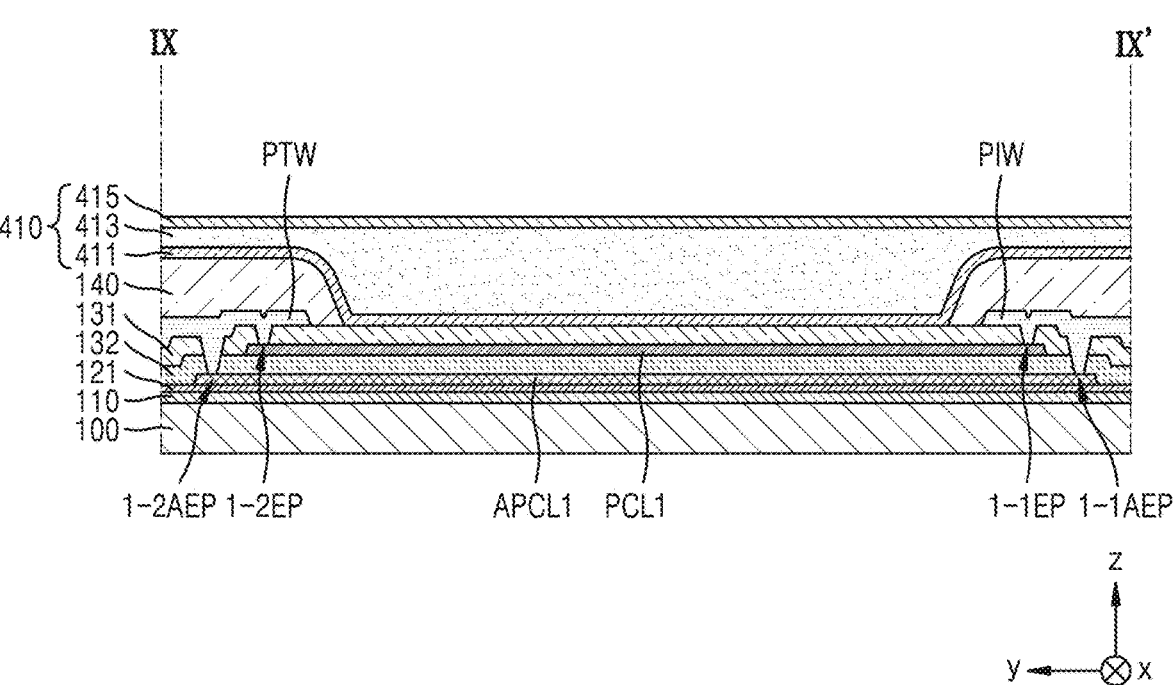
FIG. 11 is a schematic cross-sectional view of the display apparatus taken along the line IX-IX' in FIG. 9.

FIG. 9 is a schematic conceptual view of a portion of a display apparatus according to an embodiment. For example, FIG. 9 may be a conceptual view showing the region B in FIG. 2 by schematically enlarging the same. FIG. 10 is a schematic cross-sectional view of the display apparatus taken along the line I-I' in FIG. 1, the line VII-VII' in FIG. 9, and the line VIII-VIII' in FIG. 9, and FIG. 11 is a schematic cross-sectional view of the display apparatus taken along the line IX-IX' in FIG. 9.

As shown in FIG. 9, different from the display apparatus according to the embodiment described above with reference to FIG. 3, the display apparatus according to another embodiment further includes a first power connection additional line APCL1 and a second power connection additional line APCL2. As shown in FIG. 9, when viewed in the direction perpendicular to the substrate 100 (e.g., a z-axis direction), the first power connection additional line APCL1 may be disposed under the first power connection line PCL1 and may include a portion overlapping the first power connection line PCL1. Also, as shown in FIG. 9, when viewed in the direction perpendicular to the substrate 100 (e.g., the z-axis direction), the second power connection additional line APCL2 may be disposed under the second power connection line PCL2 and may include a portion overlapping the second power connection line PCL2. For example, as shown in FIG. 10, the first power connection additional line APCL1 and the second power connection additional line APCL2 may be disposed over the gate insulating layer 121, an additional interlayer insulating layer 132 may cover the first power connection additional line APCL1 and the second power connection additional line APCL2, the first power connection line PCL1 and the second power connection line PCL2 may be disposed over the additional interlayer insulating layer 132, and the interlayer insulating layer 131 may cover the first power connection line PCL1 and the second power connection line PCL2.

The additional interlayer insulating layer 132 may be an inorganic insulating layer including silicon oxide, silicon nitride, or silicon oxynitride. The first power connection additional line APCL1 and the second power connection additional line APCL2 may include a first metal layer including Ti or Al and a second metal layer disposed on the first metal layer and including Mo. For example, the first power connection additional line APCL1 and the second power connection additional line APCL2 may have the same layer structures as the first power connection line PCL1 and the second power connection line PCL2.

The first power connection additional line APCL1 may have a shape extending in the first direction (e.g., the y-axis direction) to electrically connect the power input line PIW to the power transmission line PTW. For example, as shown in FIGS. 9 and 11, a $1^{st}$-$1^{st}$ additional end portion 1-1AEP of the first power connection additional line APCL1 in the direction (e.g., the −y direction) away from the display area DA may be disposed under the power input line PIW and may be electrically connected to the power input line PIW through a contact hole (e.g., a contact opening) defined in insulating layers disposed over the first power connection additional line APCL1. When viewed in the direction perpendicular to the substrate 100 (e.g., the z-axis direction), the $1^{st}$-$1^{st}$ additional end portion 1-1AEP may be closer to the second edge E2 of the substrate 100 than the $1^{st}$-$1^{st}$ end portion 1-1EP is. As shown in FIGS. 9, 10, and 11, a $1^{st}$-$2^{nd}$ additional end portion 1-2AEP of the first power connection additional line APCL1 in the direction towards the display area DA (e.g., the +y direction) may be disposed under the power transmission line PTW and may be electrically connected to the power transmission line PTW through a contact hole (e.g., a contact opening) defined in the insulating layers disposed over the first power connection additional line APCL1. When viewed in the direction perpendicular to the substrate 100 (e.g., the z-axis direction), the $1^{st}$-$2^{nd}$ additional end portion 1-2AEP may be closer to the display area DA than the $1^{st}$-$2^{nd}$ end portion 1-2EP is.

Accordingly, the common voltage ELVSS, which is input from the printed circuit board through the second pad PD2, may be transmitted to the common voltage supply line 11 through the power input line PIW, the first power connection line PCL1, the first power connection additional line APCL1, and the power transmission line PTW, and as a result, the common voltage ELVSS may be applied to the common electrode (e.g., 315 in FIG. 10), which is electrically connected to the common voltage supply line 11. For example, not only the first power connection PCL1 but also the first power connection additional line APCL1 may electrically connect the power input line PIW to the power transmission line PTW, and thus, an IR drop due to resistance may be prevented or reduced during the transmission of the common voltage ELVSS.

As described, the second power connection additional line APCL2 extends in the first direction (e.g., the y-axis direction) to electrically connect the power input line PIW to the power transmission line PTW. For example, as shown in FIG. 9, a $2^{nd}$-$1^{st}$ additional end portion 2-1AEP of the second power connection additional line APCL2 in the direction towards the display area DA (e.g., the −y direction) may be disposed under the power input line PIW and electrically connected to the power input line PIW through a contact hole (e.g., a contact opening) defined in insulating layers disposed over the second power connection additional line APCL2. When viewed in the direction perpendicular to the substrate 100 (e.g., the z-axis direction), the $2^{nd}$-$1^{st}$ additional end portion 2-1AEP may be closer to the second edge E2 of the substrate 100 than the $2^{nd}$-$1^{st}$ end portion 2-1EP is. As shown in FIGS. 9 and 10, a $2^{nd}$-$2^{nd}$ additional end portion 2-2AEP of the second power connection additional line APCL2 in the direction towards the display area DA (e.g., the +y direction) may be disposed under the power transmission line PTW and electrically connected to the power transmission line PTW through a contact hole (e.g., a contact opening) defined in the insulating layers disposed over the second power connection additional line APCL2. When viewed in the direction perpendicular to the substrate 100 (e.g., the z-axis direction), the $2^{nd}$-$2^{nd}$ additional end portion 2-2AEP may be closer to the display area DA than the $2^{nd}$-$2^{nd}$ end portion 2-2EP is.

Accordingly, the common voltage ELVSS, which is input from the printed circuit board through the second pad PD2, may be transmitted to the common voltage supply line 11 through the power input line PIW, the first power connection line PCL1, the first power connection additional line APCL1, the second power connection line PCL2, the second power connection additional line APCL2, and the power transmission line PTW, and as a result, the common voltage ELVSS may be applied to the common electrode (e.g., 315 in FIG. 10) electrically connected to the common voltage supply line 11. For example, not only the first power connection line PCL1 and the second power connection line PCL2 but also the first power connection additional line APCL1 and the second power connection additional line APCL2 electrically connect the power input line PIW to the power transmission line PTW, and thus, an IR drop due to resistance may be prevented or reduced during the transmission of the common voltage ELVSS.

As shown in FIG. 10, the data transmission lines DTL that are adjacent to one another in the second direction (e.g., the x-axis direction) may be disposed on different layers. For example, the data transmission line DTL on the gate insulating layer 121 and the data transmission line DTL on the additional interlayer insulating layer 132 may be alternately arranged in the second direction (e.g., the x-axis direction).

As the resolution of a display apparatus increases, the number of pixels per unit area in the display area may increase, and the number of each of the data lines DL and the data transmission lines DTL required may increase accordingly. When the number of data transmission lines DTL increases, a distance between data transmission lines DTL, which are adjacent to one another in the second direction (e.g., the x-axis direction) decreases, and thus, there is a higher chance of a short circuit or defects during the manufacture of the display apparatus. However, in the display apparatus according to embodiments of the present embodiment, the data transmission line DTL disposed on the gate insulating layer 121 and the data transmission line DTL disposed on the additional interlayer insulating layer 132 are alternately arranged in the second direction (e.g., the x-axis direction), and thus, the occurrence of the short circuit may be reduced or effectively prevented even though the distance between the adjacent data transmission lines DTL decreases.

Figure 12:
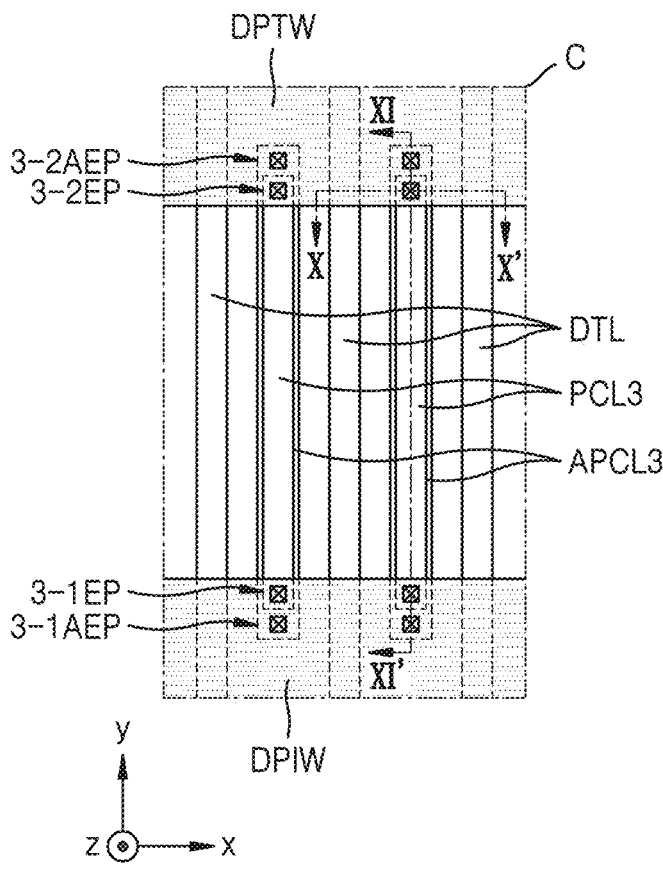
FIG. 12 is a schematic conceptual view of a portion of a display apparatus according to an embodiment.
Figure 13:
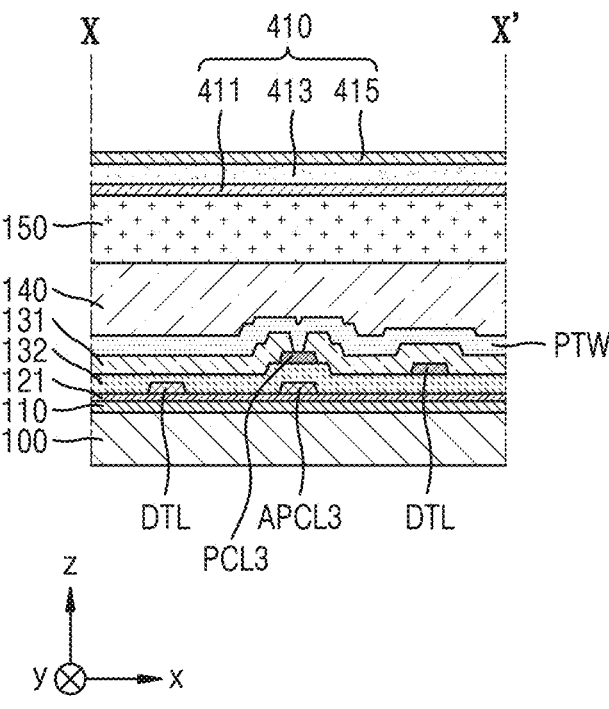
FIG. 13 is a schematic cross-sectional view of the display apparatus taken along the line X-X' in FIG. 12.
Figure 14:
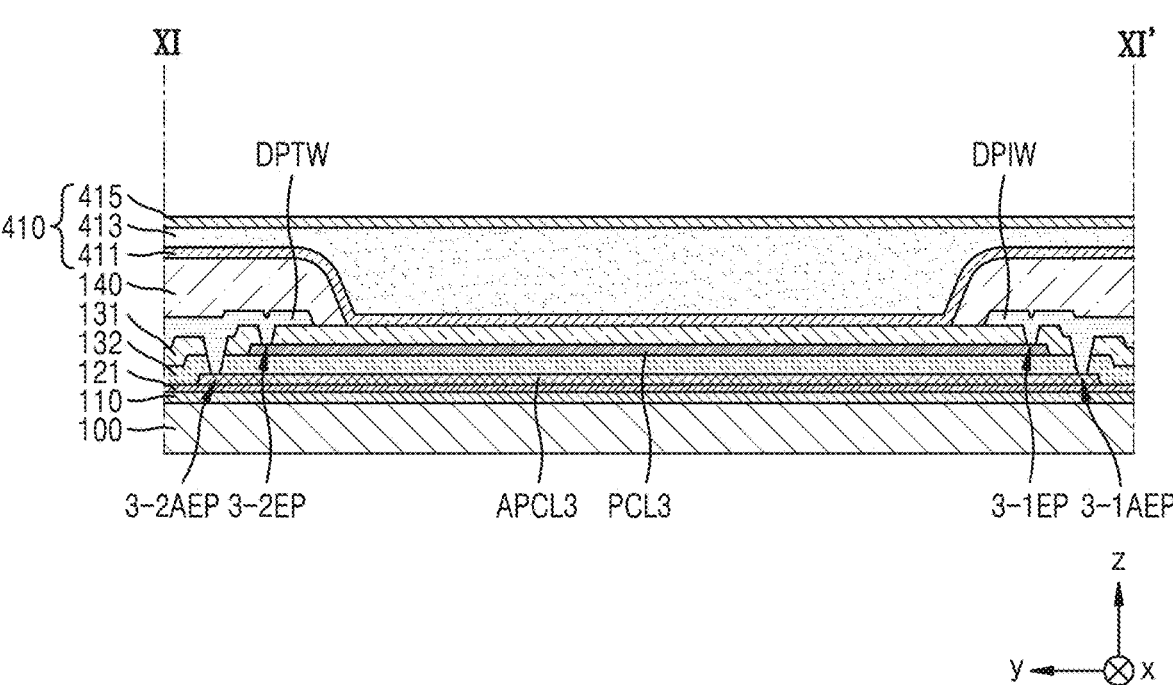
FIG. 14 is a schematic cross-sectional view of the display apparatus taken along the line XI-XI' in FIG. 12.

FIG. 12 is a schematic conceptual view of a portion of a display apparatus according to an embodiment. For example, FIG. 12 may be a conceptual view showing the region C in FIG. 2 by schematically enlarging the same. FIG. 13 is a schematic cross-sectional view of the display apparatus taken along the line X-X' in FIG. 12, and FIG. 14 is a schematic cross-sectional view of the display apparatus taken along the line XI-XI' in FIG. 12.

The display apparatus according to another embodiment of the present embodiment further includes a third power connection additional line APCL3, different from the display apparatus according to the embodiment shown in FIG. 6. The third power connection line PCL3 may also have a shape extending in the first direction (e.g., the y-axis direction) to electrically connect the driving power input line DPIW to the driving power transmission line DPTW. For example, as shown in FIG. 12, a $3^{rd}$-$1^{st}$ additional portion 3-1AEP of the third power connection additional line APCL3 in the direction (e.g., the −y direction) away from the display area DA may be disposed under the driving power input line DPIW and may be electrically connected to the driving power input line DPIW through a contact hole (e.g., a contact opening) defined in insulating layers disposed over the third power connection additional line APCL3. When viewed in the direction perpendicular to the substrate 100 (e.g., the z-axis direction), the $3^{rd}$-$1^{st}$ additional end portion 3-1AEP may be closer to the second edge E2 of the substrate 100 than the $3^{rd}$-$1^{st}$ end portion 3-1EP is. As shown in FIGS. 12 and 14, a $3^{rd}$-$2^{nd}$ additional end portion 3-2AEP of the third power connection additional line APCL3 in the direction towards the display area DA (e.g., the +y direction) may be disposed under the driving power transmission line DPTW and electrically connected to the driving power transmission line DPTW through a contact hole (e.g., a contact opening) defined in the insulating layers disposed over the third power connection additional line APCL3. When viewed in the direction perpendicular to the substrate 100 (e.g., the z-axis direction), the $3^{rd}$-$2^{nd}$ additional end portion 3-2AEP may be closer to the display area DA than the $3^{rd}$-$2^{nd}$ end portion 3-2EP is.

Accordingly, the driving voltage ELVDD, which is input from the printed circuit board through the third pad PD3, may be transmitted to the driving power lines, which are electrically connected to the driving power transmission line DPTW and extend into the display area DA, through the driving power input line DPIW, the third power connection line PCL3, the third power connection additional line APCL3, and the driving power transmission line DPTW, and as a result, the driving voltage ELVDD may be applied to the pixels electrically connected to the driving power lines, respectively. For example, not only the third power connection line PCL3 but also the third power connection additional line APCL3 may electrically connect the driving power input line DPIW to the driving power transmission line DPTW, and thus, an IR drop due to resistance may be prevented or reduced during the transmission of the driving voltage ELVDD.

The third power connection additional line APCL3 may be disposed on the gate insulating layer 121, the third power connection line PCL3 may be disposed on the additional interlayer insulating layer 132 covering the third power connection additional line APCL3, and the interlayer insulating layer 131 may cover the third power connection line PCL3. As shown in, for example, FIG. 13, from among the data transmission lines DTL, which are adjacent to one another in the second direction (e.g., the x-axis direction), the data transmission line DTL disposed on the gate insulating layer 121 and the data transmission line DTL disposed on the additional interlayer insulating layer 132 may be alternately arranged in the second direction (e.g., the x-axis direction).

Figure 15:
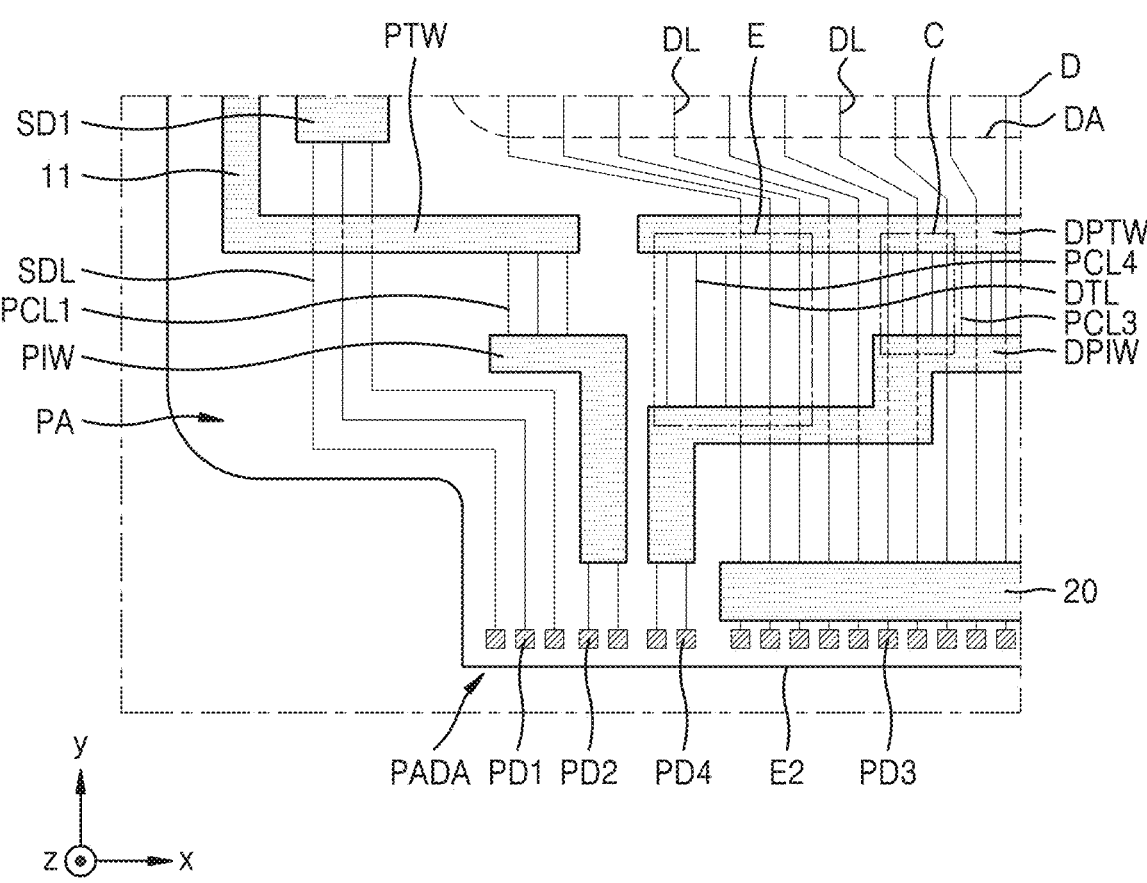
FIG. 15 is a schematic conceptual view of a portion of a display apparatus according to an embodiment.

According to the embodiments described above with reference to FIGS. 1 to 8, the power input line PIW and the power transmission line PTW are electrically connected to the first power connection line PCL1, which is arranged outside the data transmission lines DTL, and the second power connection line PCL2, which is arranged between the data transmission lines DTL, and the driving power input line DPIW and the driving power transmission line DPTW are electrically connected only to the third power connection line PCL3 arranged between the data transmission lines DTL. However, the present disclosure is not limited thereto. For example, as shown in FIG. 15, which is a conceptual view schematically showing a portion of a display apparatus according to an embodiment, the driving power input line DPIW and the driving power transmission line DPTW may be electrically connected to each other by the third power connection line PCL3 and a fourth power connection line PCL4, and the third power connection line PCL3 is arranged between the data transmission lines DTL and the fourth power connection line PCL4 is arranged outside the data transmission lines DTL.

Figure 16:
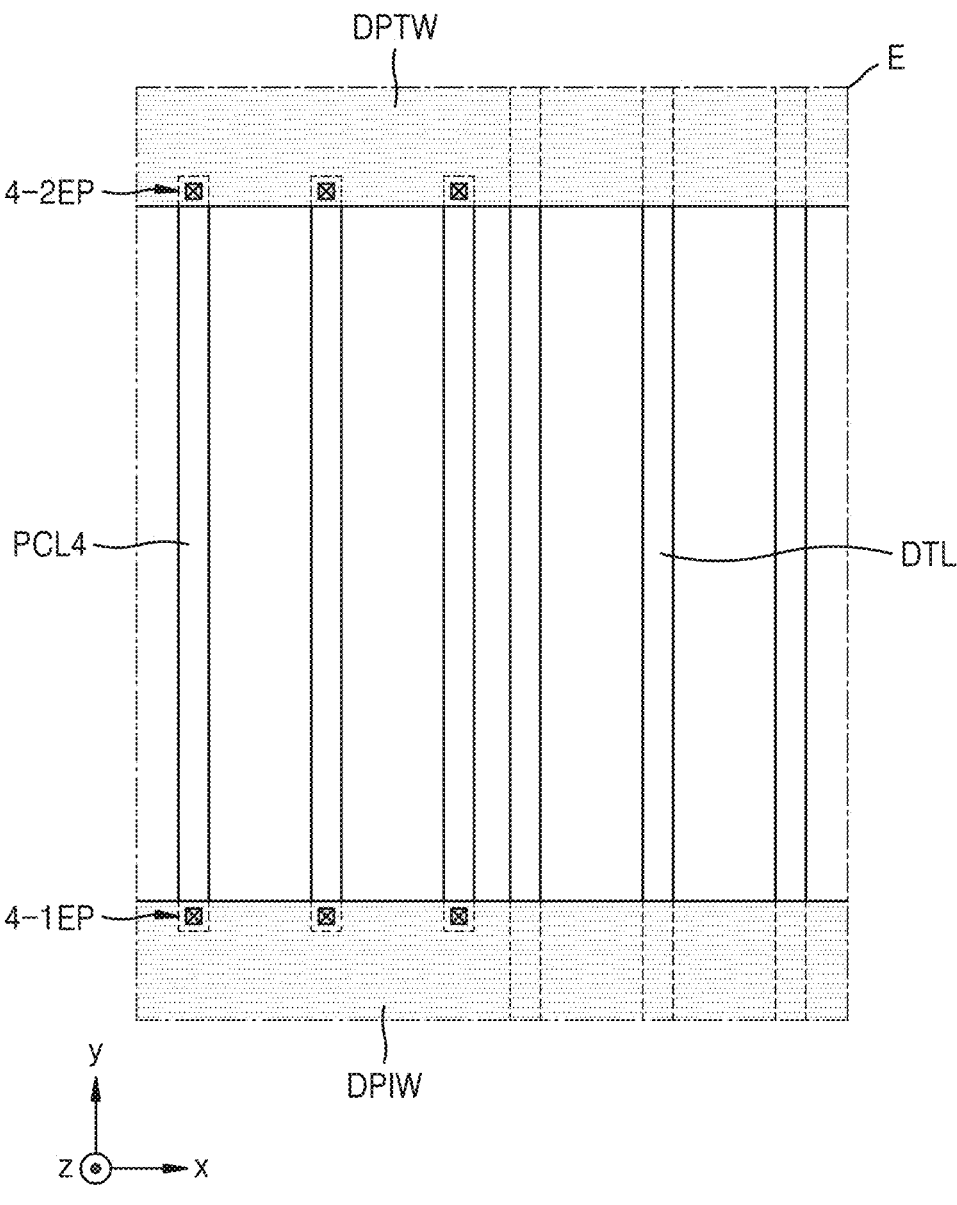
FIG. 16 is a conceptual view of the enlarged region E in FIG. 15.

Other than the fourth power connection line PCL4 electrically connecting the driving power input line DPIW to the driving power transmission line DPTW, the fourth power connection line PCL4 may have the same configuration as the first power connection line PCL1 electrically connecting the power input line PIW to the power transmission line PTW. For example, as shown in FIG. 16, which is a conceptual view showing the enlarged region E in FIG. 15, a $4^{th}$-$1^{st}$ end portion 4-1EP of the fourth power connection line PCL4 in the direction (e.g., the −y direction) away from the display area DA may be disposed under the driving power input line DPIW and electrically connected to the driving power input line DPIW through a contact hole (e.g., a contact opening) defined in an insulating layer disposed over the fourth power connection line PCL4. A $4^{th}$-$2^{nd}$ end portion 4-2EP of the fourth power connection line PCL4 in the direction towards the display area DA (e.g., a +y direction) may be disposed under the driving power transmission line DPTW and electrically connected to the driving power transmission line DPTW through a contact hole (e.g., a contact opening) defined in the insulating layer disposed over the fourth power connection line PCL4.

Figure 17:
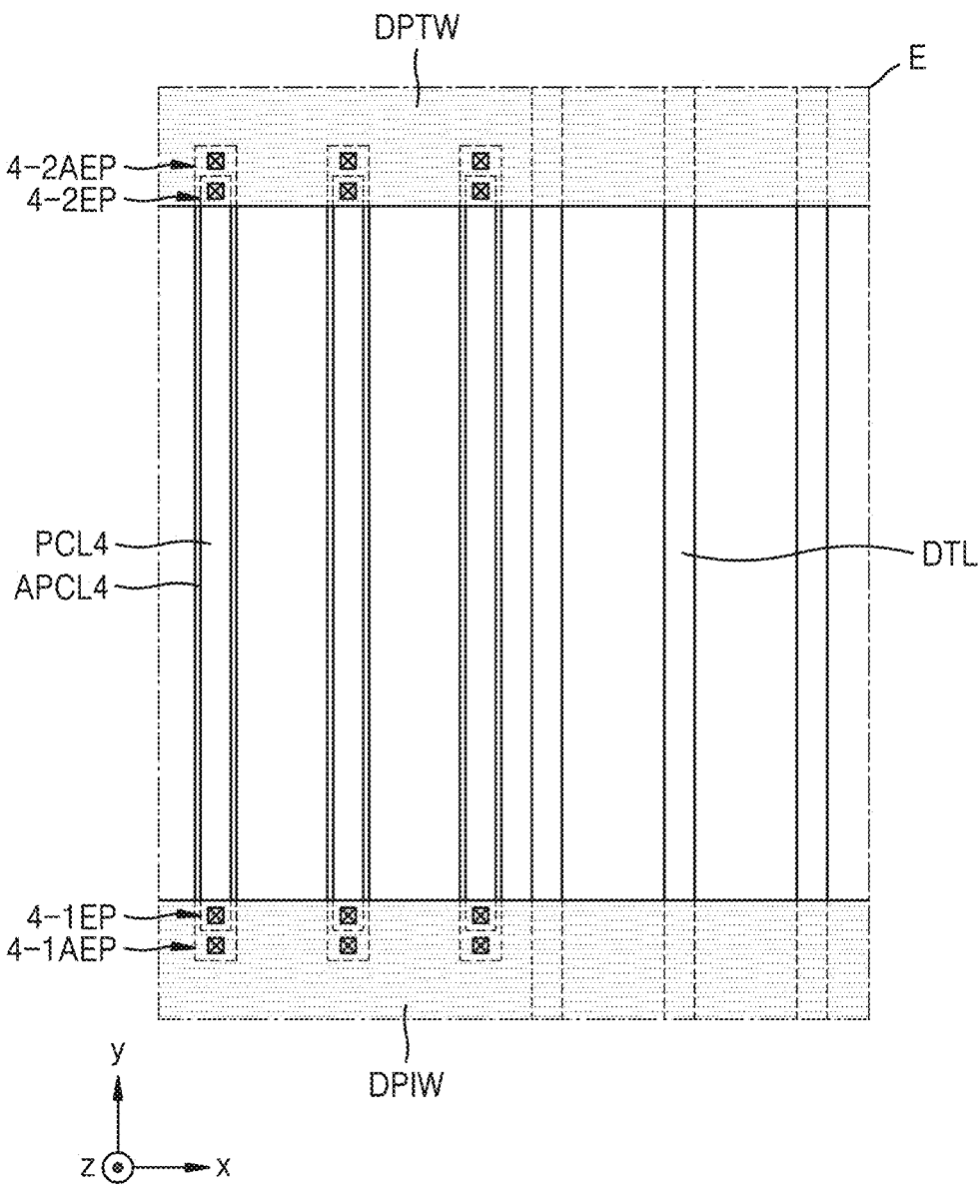
FIG. 17 is a schematic conceptual view of a portion of a display apparatus according to an embodiment.

Furthermore, as shown in FIG. 17, which is a conceptual view schematically showing a portion of a display apparatus according to another embodiment, the display apparatus may further include a fourth power connection additional line APCL4. The fourth power connection line PCL4 may also have a shape extending in the first direction (e.g., the y-axis direction) to electrically connect the driving power input line DPIW to the driving power transmission line DPTW. For example, as shown in FIG. 17, a $4^{th}$-$1^{st}$ additional end portion 4-1AEP of the fourth power connection additional line APCL4 in the direction (e.g., the −y direction) away from the display area DA may be disposed under the driving power input line DPIW and may be electrically connected to the driving power input line DPIW through a contact hole (e.g., a contact opening) defined in insulating layers disposed over the fourth power connection additional line APCL4. When viewed in the direction perpendicular to the substrate 100 (e.g., the z-axis direction), the $4^{th}$-$1^{st}$ additional end portion 4-1AEP may be closer to the second edge E2 of the substrate 100 than the $4^{th}$-$1^{st}$ end portion 4-1EP is. A $4^{th}$-$2^{nd}$ additional end portion 4-2AEP of the fourth power connection additional line APCL4 in the direction towards the display area DA (e.g., the +y direction) may be disposed under the driving power transmission line DPTW and electrically connected to the driving power transmission line DPTW through a contact hole (e.g., a contact opening) defined in the insulating layers disposed over the fourth power connection additional line APCL4. When viewed in the direction perpendicular to the substrate 100 (e.g., the z-axis direction), the $4^{th}$-$2^{nd}$ additional end portion 4-2AEP may be closer to the display area DA than the $4^{th}$-$2^{nd}$ end portion 4-2EP is.

Accordingly, the driving voltage ELVDD, which is input from the printed circuit board through the third pad PD3, may be transmitted to the driving power lines, which are electrically connected to the driving power transmission line DPTW and extend into the display area DA, through the driving power input line DPIW, the third power connection line PCL3, the third power connection additional line APCL3, the fourth power connection line PCL4, the fourth power connection additional line APCL4, and the driving power transmission line DPTW, and as a result, the driving voltage ELVDD may be applied to the pixels electrically connected to the driving power lines, respectively. For example, not only the third power connection line PCL3 and the fourth power connection line PCL4 but also the third power connection additional line APCL3 and the fourth power connection additional line APCL4 electrically connect the driving power input line DPIW to the driving power transmission line DPTW, and thus an IR drop due to resistance may be prevented or reduced during the transmission of the driving voltage ELVDD.

The fourth power connection additional line APCL4 may be disposed on the gate insulating layer 121, the fourth power connection line PCL4 may be disposed on the additional interlayer insulating layer 132 covering the fourth power connection additional line APCL4, and the interlayer insulating layer 131 may cover the fourth power connection line PCL4.

According to the embodiments of the present disclosure, a display apparatus that displays high-quality images may be realized. However, the scope of the present disclosure is not limited to these aspects and features.

It should be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:
1. A display apparatus comprising:
a substrate having a display area and a peripheral area outside the display area;

a scan driving circuit in the peripheral area and adjacent to a first edge of the substrate, the first edge extending in a first direction;
a scan driving circuit line in the peripheral area and adjacent to a second edge of the substrate, the second edge extending in a second direction crossing the first direction, the scan driving circuit line being electrically connected to the scan driving circuit;
a first power connection line in the peripheral area, adjacent to the second edge, and extending in the first direction from a $1^{st}$-$1^{st}$ end portion to a $1^{st}$-$2^{nd}$ end portion, the $1^{st}$-$1^{st}$ end portion being farther from the display area than the $1^{st}$-$2^{nd}$ end portion is, the first power connection line being between a center of the second edge in the second direction and the scan driving circuit line;
a power input line over the $1^{st}$-$1^{st}$ end portion of the first power connection line and being electrically connected thereto through a contact hole; and
a plurality of data transmission lines in the peripheral area, adjacent to the second edge, extending in the first direction, and between the center of the second edge in the second direction and the first power connection line,
wherein each of the plurality of data transmission lines has a first portion overlapping the power input line and a second portion outside the power input line when viewed in a direction perpendicular to the substrate, and the plurality of data transmission lines are disposed under the power input line.

2. The display apparatus of claim 1, wherein the first power connection line and the scan driving circuit line are on a same layer.

3. The display apparatus of claim 1, further comprising a power transmission line over the $1^{st}$-$2^{nd}$ end portion of the first power connection line and electrically connected thereto.

4. The display apparatus of claim 3, further comprising a plurality of pixels arranged in the display area, the plurality of pixels having a common electrode arranged therein,
wherein the power transmission line extends along the second edge and is electrically connected to the common electrode.

5. The display apparatus of claim 3, further comprising a plurality of driving power lines extending in the first direction into the display area,
wherein the power transmission line extends along the second edge and is electrically connected to the plurality of driving power lines.

6. The display apparatus of claim 1, further comprising a first power connection additional line under the first power connection line and having a portion overlapping the first power connection line when viewed in a direction perpendicular to the substrate, the first power connection additional line extending between a $1^{st}$-$1^{st}$ additional end portion and a $1^{st}$-$2^{nd}$ additional end portion, the $1^{st}$-$1^{st}$ additional end portion being farther from the display area than the $1^{st}$-$2^{nd}$ additional end portion is,
wherein the power input line is electrically connected to the $1^{st}$-$1^{st}$ additional end portion of the first power connection additional line.

7. The display apparatus of claim 6, wherein, when viewed in the direction perpendicular to the substrate, the $1^{st}$-$1^{st}$ additional end portion is closer to the second edge than the $1^{st}$-$1^{st}$ end portion is.

8. The display apparatus of claim 1, further comprising a second power connection line between the plurality of data transmission lines and extending in the first direction, the second power connection line extending between a $2^{nd}$-$1^{st}$ end portion and a $2^{nd}$-$2^{nd}$ end portion, the $2^{nd}$-$1^{st}$ end portion being farther from the display area than the $2^{nd}$-$2^{nd}$ end portion is, wherein the power input line is electrically connected to the $2^{nd}$-$1^{st}$ end portion of the second power connection line.

9. The display apparatus of claim 8, wherein the second power connection line and the first power connection line are on a same layer.

10. The display apparatus of claim 8, further comprising a power transmission line over the $1^{st}$-$2^{nd}$ end portion of the first power connection line and over the $2^{nd}$-$2^{nd}$ end portion of the second power connection line and being electrically connected thereto, the $1^{st}$-$2^{nd}$ end portion of the first power connection line and the $2^{nd}$-$2^{nd}$ end portion of the second power connection line being ends of the respective first power connection line and the second power connection line that are nearest to the display area.

11. The display apparatus of claim 10, further comprising a plurality of pixels arranged in the display area, the plurality of pixels having a common electrode arranged therein, wherein the power transmission line extends along the second edge and is electrically connected to the common electrode.

12. The display apparatus of claim 10, further comprising a plurality of driving power lines extending in the first direction into the display area, wherein the power transmission line extends along the second edge and is electrically connected to the plurality of driving power lines.

13. The display apparatus of claim 8, further comprising:

a first power connection additional line under the first power connection line and having a portion overlapping the first power connection line when viewed in a direction perpendicular to the substrate; and a second power connection additional line under the second power connection line and having a portion overlapping the second power connection line when viewed in the direction perpendicular to the substrate, wherein the power input line is electrically connected to a $1^{st}$-$1^{st}$ additional end portion of the first power connection additional line and a $2^{nd}$-$1^{st}$ additional end portion of the second power connection additional line, the $1^{st}$-$1^{st}$ additional end portion of the first power connection additional line and the $2^{nd}$-$1^{st}$ additional end portion of the second power connection additional line being ends of the first power connection additional line and the second power connection additional line that are farthest from the display area.

14. The display apparatus of claim 13, wherein, when viewed in the direction perpendicular to the substrate, the $1^{st}$-$1^{st}$ additional end portion is nearer to the second edge than the $1^{st}$-$1^{st}$ end portion is, and the $2^{nd}$-$1^{st}$ additional end portion is nearer to the second edge than the $2^{nd}$-$1^{st}$ end portion is.

15. The display apparatus of claim 1, further comprising a plurality of second power connection lines arranged between the plurality of data transmission lines and extending in the first direction, wherein the power input line is electrically connected to a $2^{nd}$-$1^{st}$ end portion of each of the plurality of second power connection lines, the $2^{nd}$-$1^{st}$ end portion of each of the plurality of second power connection lines being farthest from the display area.

16. The display apparatus of claim 1, further comprising a thin-film transistor in the display area and comprising a gate electrode, a semiconductor layer, and at least one of a source electrode and a drain electrode, wherein the first power connection line and the gate electrode are on a same layer.

17. The display apparatus of claim 16, wherein the first power connection line and the gate electrode comprise a first metal layer and a second metal layer on the first metal layer.

18. The display apparatus of claim 17, wherein the first metal layer comprises titanium or aluminum, and the second metal layer comprises molybdenum.

19. The display apparatus of claim 1, further comprising:

a display element in the display area; and an encapsulation layer covering the display element and comprising an inorganic encapsulation layer and an organic encapsulation layer on the inorganic encapsulation layer, wherein the inorganic encapsulation layer is in direct contact with the first power connection line or an insulating layer covering the first power connection line, the inorganic encapsulation layer comprising an inorganic material.

* * * * *